(12) United States Patent
Bhullar

(10) Patent No.: US 12,451,842 B2
(45) Date of Patent: Oct. 21, 2025

(54) VARIABLE TRANSIMPEDANCE AMPLIFIER FOR LOW POWER, HIGH DYNAMIC RANGE, HIGH DATA RATE LINEAR

(71) Applicant: SEMTECH CORPORATION, Camarillo, CA (US)

(72) Inventor: Gurpreet Singh Bhullar, Ottawa (CA)

(73) Assignee: SEMTECH CORPORATION, Camarillo, CA (US)

( * ) Notice: Subject to any disclaimer, the term of this patent is extended or adjusted under 35 U.S.C. 154(b) by 497 days.

(21) Appl. No.: 18/079,840

(22) Filed: Dec. 12, 2022

(65) Prior Publication Data

US 2024/0195360 A1   Jun. 13, 2024

(51) Int. Cl.
  *H03F 1/02* (2006.01)
  *H03F 3/08* (2006.01)
  *H03F 3/45* (2006.01)
(52) U.S. Cl.
  CPC ......... *H03F 1/0211* (2013.01); *H03F 3/4508* (2013.01)
(58) Field of Classification Search
  CPC ........ H03F 1/0211; H03F 3/4508; H03F 1/22; H03F 3/211; H03F 3/50; H03F 3/087; H03G 3/3084

USPC ......................................... 330/308, 310, 278
See application file for complete search history.

(56) References Cited

U.S. PATENT DOCUMENTS 6,844,784 B1    1/2005  Denoyer et al.
11,394,349 B2 *  7/2022  Sugimoto ............ H03G 3/3084

* cited by examiner

*Primary Examiner* — Hieu P Nguyen
(74) *Attorney, Agent, or Firm* — Morgan, Lewis & Bockius LLP

(57) ABSTRACT

A variable transimpedance amplifier may include first and second amplifiers. Each of the first and second amplifiers may include a transistor amplifier with a feedback resistor and a capacitor. The output node of the first amplifier may be an output node of the variable transimpedance amplifier. The output node of the second amplifier is not part of the output node of the variable transimpedance amplifier. The open loop gains of the transistor amplifiers may be variable, but the feedback resistor values can be fixed. The transimpedance may be determined by the feedback resistors and a scaling factor proportional to ratio of open loop gains. The transistor amplifiers may share an input transistor. The configuration can provide a high dynamic range of variable transimpedance that is stable over process and operating condition variations, minimize input capacitance loading and noise contribution to small input signals.

22 Claims, 8 Drawing Sheets

Variable Transimpedance Stage 306
(306-1 and 306-2)
with input node 306-I and output node 306-O

VARIABLE TRANSIMPEDANCE AMPLIFIER FOR LOW POWER, HIGH DYNAMIC RANGE, HIGH DATA RATE LINEAR

BACKGROUND

A transimpedance amplifier is a current to voltage converter, with a common implementation employing an inverting amplifier with shunt feedback. A fixed transimpedance amplifier for a high dynamic range, high data rate linear applications may require high power implementations; however, high power transimpedance amplifiers may not be suitable for modern data center communication equipment because such amplifiers may not meet, among others, the required high port densities. In silicon-germanium (SiGe) BiCMOS technologies, field-effect transistor (FET) switches used in a transimpedance amplifier design may exhibit relatively high parasitic resistance and capacitance at critical nodes. As a consequence, their use may be limited to low data rate applications or applications which are not part of advanced data communications. For high data rate data communications where significantly wide bandwidth and broadband amplifiers with high linear dynamic range and low power are required, improved transimpedance amplifiers are needed.

The description provided in the background section should not be assumed to be prior art merely because it is mentioned in or associated with the background section. The background section may include information that describes one or more aspects of the subject technology, and the description in this section does not limit the invention.

BRIEF DESCRIPTION OF THE DRAWINGS

The accompanying drawings, which are included to provide a further understanding of the disclosure, are incorporated in and constitute a part of this disclosure, illustrate embodiments of the disclosure, and together with the description serve to explain principles of the disclosure.

Figure 1:
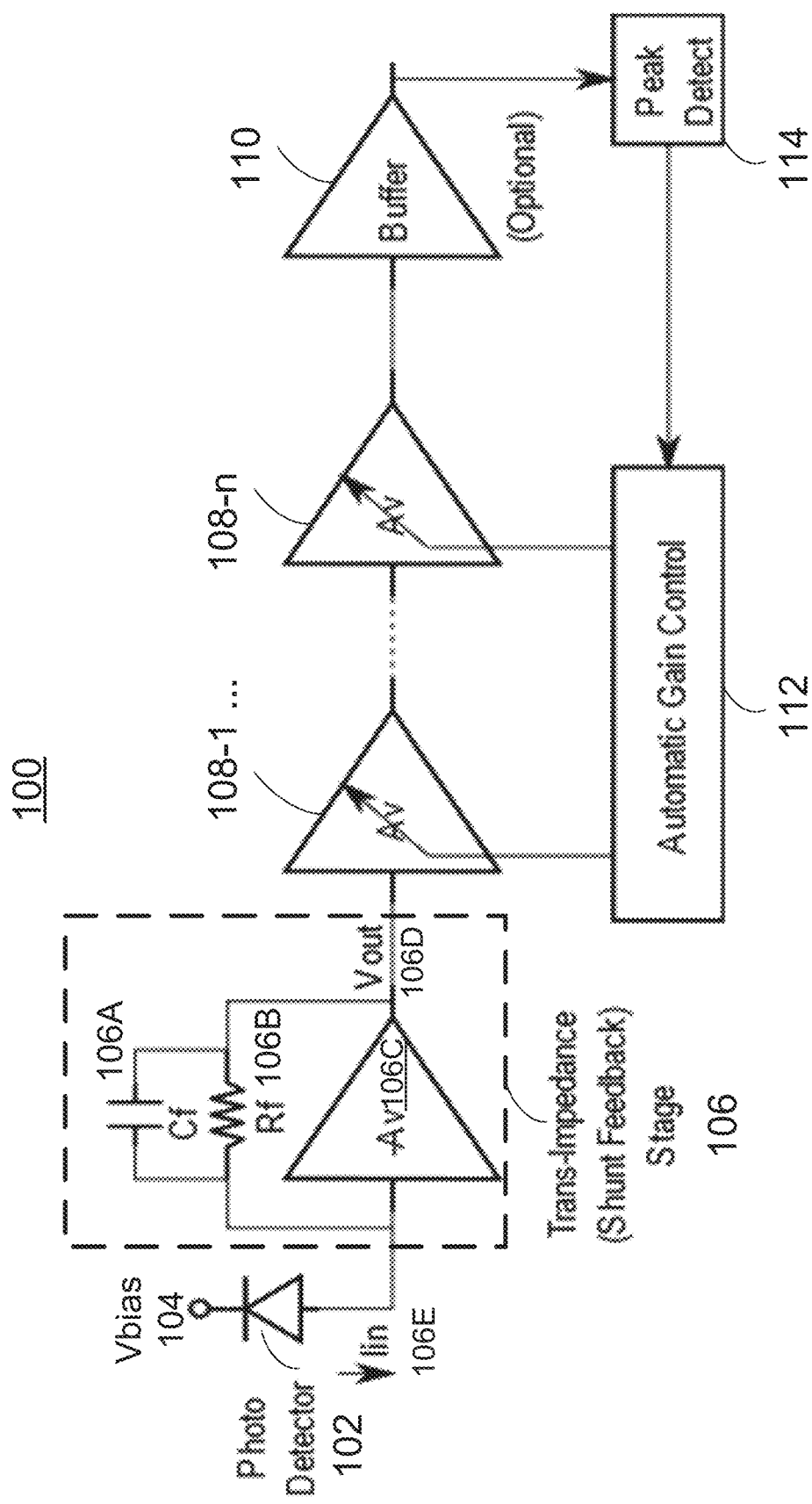
FIG. 1 illustrate a schematic diagram of an example of an optical receiver data path.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

The present description relates to transimpedance devices, including, without limitation, to variable transimpedance amplifier for low power, high dynamic range, high data rate linear applications.

A transimpedance amplifier (TIA) is a current to voltage converter, with a common implementation employing an inverting amplifier with shunt feedback for high data rate applications. The transimpedance amplifier may be used to amplify the current output of a variety of devices, such as, for example, photo detectors, Geiger-Müller tubes, photo multiplier tubes, accelerometers, or other types of sensors, to a desired voltage. The transimpedance amplifier may present a low impedance to the photodiode and isolate it from the output voltage of the amplifier. A transimpedance amplifier may include a feedback resistor, Rf. The transimpedance (Tz) which is the Vout/Iin transfer function of the transimpedance amplifier is determined largely by this feedback resistor Rf under certain simplified conditions and may be represented as a negative value −Rf to indicate inverting configuration. In one or more examples, transimpedance may refer to trans-impedance and vice versa.

High data rate linear applications may impose a linearity requirement on the transimpedance amplifier. For a linear signal transfer function, as the input increases, the output increases linearly. For a limiting application, a high gain may be applied such that the output starts to limit for a low input signal level and output level may not increase linearly with input. A pulse amplitude modulation 4-level (PAM4) is a modulation scheme that combines two bits into a single symbol with four levels of amplitude. If an application pertains to a modulation, such as the PAM4 modulation, it is a linear application. In contrast, non-return-to-zero (NRZ), which may be sometime referred to as a pulse amplitude modulation 2-level, is a binary scheme using low and high signal levels to represent the I/O information of a digital signal. If an application pertains to an NRZ modulation, it is generally a limiting application. For linear applications, the linearity requirements apply over the dynamic range of the input signal. Although limiting applications may also have input dynamic range requirements, they are generally constrained to initial stage of transimpedance amplifier and have less impact on power consumption. For linear applications, the linearity requirements apply to all amplifier stages in a transimpedance amplifier. As such input dynamic range for linear applications which employ PAM4 modulation or higher order modulations, may be more demanding and more important for power consumption of the transimpedance amplifier.

In one or more aspects, transimpedance amplifiers used in optical receivers for high speed data communications may be required to accommodate a large linear input signal dynamic range of up to 30 dB in amplitude. This is an example, and the subject technology is not limited thereto.

The large linear input dynamic range places a constraint on the transimpedance (Tx or Vout/Iin) at the first stage (e.g., a front end or a transimpedance stage) of the optical receiver data path. The constraint forces a tradeoff between the performance at a low end of dynamic range (sensitivity) and a high end of dynamic range (overload). In well-known analysis of shunt feedback TIA, sensitivity performance is improved with a larger Tz value implying a larger Rf value, whereas overload performance including linearity places a limit on the maximum Tz value forcing a smaller Rf value. This tradeoff typically leads to a sub-optimal sensitivity or overload performance for a fixed Tz TIA. Additionally, for a fixed Tz transimpedance amplifier at the front end stage, a subsequent linear amplifier is required to accommodate a large linear dynamic range which forces a higher power implementation to avoid signal degradation. High power transimpedance amplifiers are not amenable to high port densities required for modern data center communication equipment at ever increasing data rates. One approach to alleviating the tradeoff between sensitivity performance and dynamic range may be to employ automatic gain control (AGC) in the Tz stage in addition to the subsequent linear amplifier stages which are more commonly used. AGC may include a control loop that detects signal level at the output of an amplifier and adjusts the gain of amplifier to maintain a constant desired signal level at the output. Implementation of AGC in the Tz stage requires a variable trans-impedance (variable Tz) which is specific to the choice of technology such as complementary metal-oxide semiconductor (CMOS) or silicon-germanium (SiGe) bipolar-CMOS (BiC-MOS) for implementing the TIA. While several considerations may determine the choice of technology. SiGe BiC-MOS is a common choice for high data rate linear applications. SiGe BiCMOS technologies typically have a high performance bipolar junction transistor (BJT) negative-positive-negative (NPN) device suitable for high data rate applications; however, the CMOS field-effect transistor (FET) devices in BiCMOS technologies are typically several generations older compared to the most current CMOS technologies and are not amenable to high frequency operation. As such a common approach to using FET switches to achieve variable Tz in the Tz stage is not practical.

In one or more aspects, an approach utilizing high performance devices such as negative-positive-negative (NPN) SiGe BJTs in achieving a high dynamic range of variable Tz stage for AGC may be preferred for modern high data rate applications. A high data rate may be, for example, a data rate greater than 1 GBaud (e.g., 10 GBaud, 13 GBaud, or 53 GBaud), and a high bandwidth may be, for example, about 0.75 times the data rate; however, the subject technology is not limited thereto.

Another example approach may employ a BJT transistor's emitter impedance directly at the input of the TIA to effectively shunt the input current from the photo detector (PD) away from TIA for larger signal levels. Such an approach may be limited to a smaller achievable dynamic range of variable Tz due to its impact on high frequency response distortion and be sensitive to process variation of the BJT transistor and operating conditions such as temperature.

FIG. 1 illustrates a schematic diagram of an example of an optical receiver data path 100.

In FIG. 1, the optical receiver data path 100 used in an optical application may include a photo detector 102. The photo detector 102 may connect to a node at a first end to receive a bias voltage 104 and connect to a transimpedance stage 106 at a second end. The transimpedance stage 106 may include, or may be referred to as, a shunt feedback amplifier 106 or a transimpedance amplifier 106. The transimpedance stage 106 may be sometimes referred to as a shunt feedback stage/amplifier, a shunt feedback amplifier/stage, a transimpedance stage/amplifier, a transimpedance amplifier/stage, or a fixed transimpedance amplifier/stage. The shunt feedback amplifier 106 may include a network of a feedback resistor Rf 106B, a capacitor Cf 106A and an amplifier 106C with an inverting open loop forward voltage gain (−Av).

The subsequent stages 108-1 . . . to 108-n after the transimpedance stage 106 may provide an additional gain so that there may be a number of variable gain stages to amplify the signal from the transimpedance stage 106. The signal may then be buffered by an optional buffer 110 for sending the buffered signal to a next block of circuits (not shown). In addition, the buffered signal may be provided to a peak detector 114, which may detect signal level representative of signal amplitude. An automatic gain control 112 may receive its input signals from the peak detector 114. The automatic gain control 112 is connected to each of the subsequent variable gain amplifier stages 108-1 . . . to 108-n.

The transimpedance stage 106 may have a feedback resistor Rf 106B with a fixed resistance so that the feedback resistor Rf may represent the transimpedance of the transimpedance stage 106.

The parameters of the shunt feedback amplifier 106 may be represented and calculated as shown below, where the shunt feedback includes the feedback resistor Rf 106B and the capacitor Cf 106A:

Tz: transimpedance (Vout/Iin), which is an output voltage 106D divided by an input current 106E of the shunt feedback amplifier 106 with the shunt feedback Rf (or $R_f$): Resistance of the feedback resistor Rf 106B $A_v$: Open loop forward voltage gain of the inverting amplifier 106C (without the shunt feedback)

$R_{in}$: Input impedance of the shunt feedback amplifier 106 (with the shunt feedback)

$\overline{I_{n_{in}}^2}$: Input referred noise for the shunt feedback amplifier 106 (with the shunt feedback)

k: Boltzman's constant

T: Absolute temperature $\overline{V_{ni_A}^2}$: Input referred voltage noise of the open loop amplifier (without shunt feedback)

$$T_z = -\frac{A_v}{1+A_v}R_f$$

$$R_{in} = \frac{R_f}{1+A_v}$$

$$\overline{I_{n_{in}}^2} = \frac{4kT}{R_f} + \frac{\overline{V_{ni_A}^2}}{R_f^2}$$

In the shunt feedback amplifier 106 shown in FIG. 1, the transimpedance of the shunt feedback amplifier 106 is defined by the function of the output voltage Vout 106D divided by the input current Iin 106E from the photo detector 102, and the transimpedance value is effectively the fixed value of resistor Rf 106B under simplifying conditions of sufficiently high gain and sufficiently low output impedance of inverting amplifier. As the input current from the optical signal increases, i.e., as the optical power in the input signal increases, the current from the photo detector 102 may increase, and that increase in the signal current may generate a larger voltage at the output of shunt feedback amplifier 106. The output voltage Vout 106D is a product of the transimpedance value, which is effectively the resistor Rf 106B, and the input current. The dynamic range of the output voltage Vout 106D of the transimpedance stage 106 is equal to the dynamic range of the input current Iin 106E from the photo detector 102, which means that the large input signal dynamic range may appear at the output of the transimpedance stage 106.

To maximize sensitivity of transimpedance stage 106, resistor Rf 106B is required to be maximized. However, a large resistor Rf 106B implicates a large signal level for the high end of the input dynamic range at the output of the transimpedance stage 106 presented to the variable gain linear amplifier 108-1. The power supply voltage and in turn the power consumption of the linear amplifier 108-1 is dependent on the maximum input signal level at its input for a given linearity requirement.

An optical application typically may have a large dynamic range requirement, because in the optical power loss in application network may vary substantially from one link to another depending on optical components in the link and the length of fiber in the link. For a link with a long fiber and with a high power loss, the signal power that reaches the receiver may be significantly lower than links where power loss is small. For a link with a short fiber where the receiver is close to the transmitter, the loss may be small and the receiver may receive the full power of the transmitter. The transmitter may have a range of power it can output to the receiver and when a high power transmitter is placed close to the receiver, the receiver may receive a significantly larger signal power than the high loss link. Industrial standards define the optical power range that a receiver would need to accommodate depending on the application. In some examples, about 15 dB in optical power range is needed, and this may represent 30 dB in the voltage range. These values are examples, and the subject technology is not limited thereto.

Optical signal at the receiver and corresponding current from a PD may comprise of an average power component or DC level and an AC component representing transmitted data typically of a frequency band greater than a minimum frequency. The average power component is not exactly related to the AC component and may be a function of the transmitter and its operating conditions such as temperature. The average power or DC level of input signal is typically sensed separately and removed at the input of the TIA using well known techniques relating to DC cancellation and does not pertain to this invention. The AC component of the signal and its dynamic range, however, is of particular concern as the TIA must accommodate the AC component's large dynamic range with minimal distortion. For linear applications, the large dynamic range of the AC component of input signal needs to be accommodated by the initial linear variable gain stages for a fixed Tz first input stage without degrading signal due to non-linearity. The linear dynamic range requirements for the initial linear variable gain stages may force operation from a high supply voltage level. For high data rates, these high bandwidth linear stages may burn substantial power particularly when operating from a higher power supply level.

FIG. 1 illustrates an example graph of the variable transimpedance range and power consumption tradeoff relationship.

Traditionally, challenges are presented in the transimpedance stage implementations. There is a fundamental tradeoff between sensitivity and input dynamic range (overload) which may force a sub-optimal design for sensitivity. Tz may be limited by linearity requirements at overload instead of maximizing gain for noise. Bandwidth (peaking) in the front end may be set by the overload requirements instead of being optimized for sensitivity. A fixed, suboptimal Tz may implicate a large dynamic range at the transimpedance amplifier output, and a larger gain requirement in the subsequent linear amplifiers may implicate a larger power.

The range of variable Tz in the Tz stage can have a significant impact on the power consumption of the linear amplifier. Typically, a smaller range of variable Tz in Tz stage may enable achieving required dynamic range at input of optical receiver. However, a larger range of variable Tz in Tz stage can further ease the linear dynamic range requirement of subsequent linear amplifier and enable lower power implementation. With a sufficiently large variable Tz range, the linear amplifier may be operated from a lower power supply, significantly lowering the power consumption of the TIA. There are several challenges imposed by a larger variable Tz range in implementation of the Tz stage that relate to distortion in high frequency operation and stability of the Tz stage. Such challenges may prevent larger variable Tz range implementations and realization of lower power TIAs for high dynamic range, high data rate applications. The present disclosure describes an approach to achieving high dynamic range variable Tz in the Tz stage for TIAs in high data rate linear applications that enables low power consumption implementation. The approach in the present disclosure enables higher dynamic range for variable Tz through self-compensation for high frequency response of the Tz stage and achieves a variable Tz dynamic range that is less sensitive to process variation.

Figure 2:
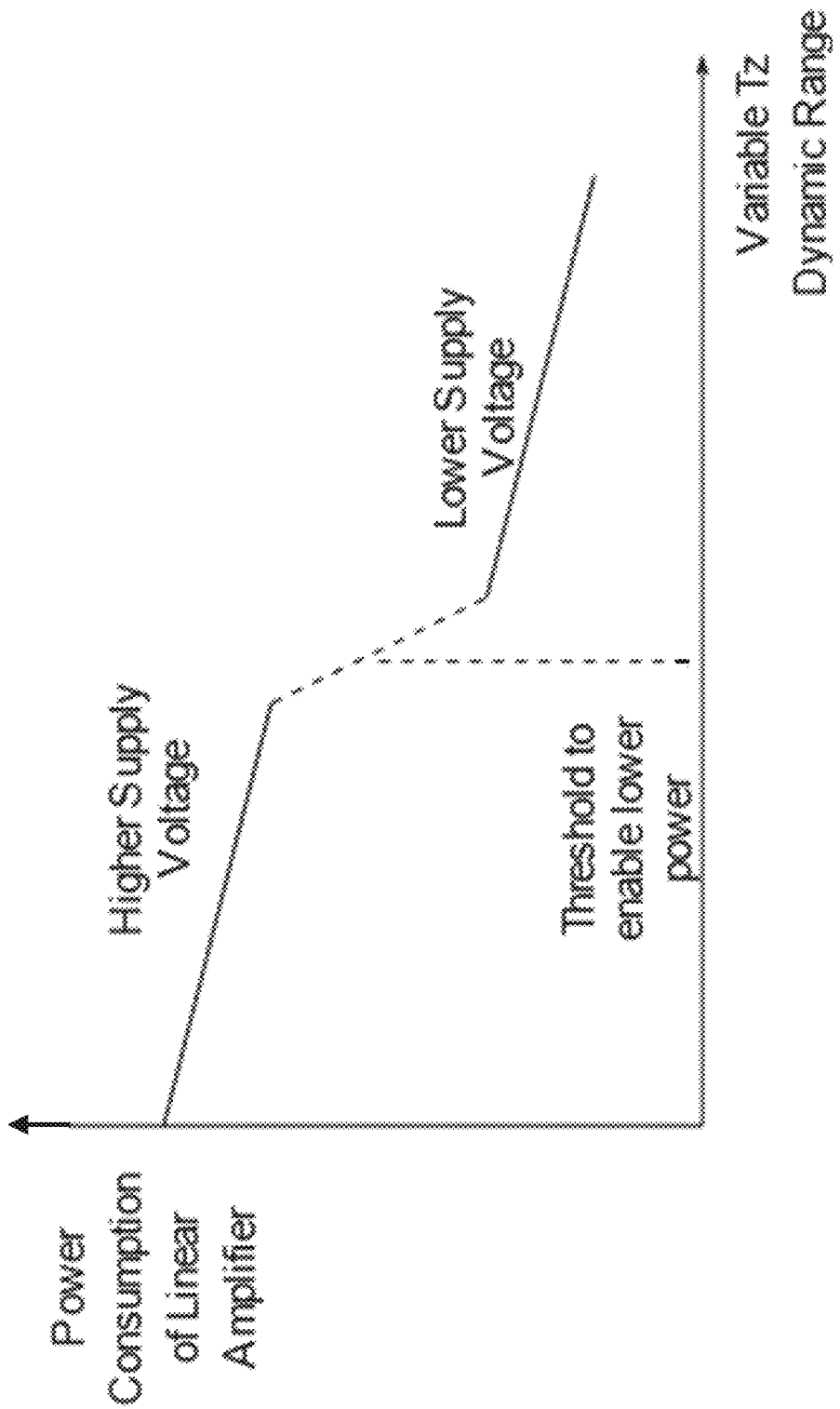
FIG. 2 illustrates an example graph of the variable transimpedance range and power consumption tradeoff relationship.

FIG. 2 illustrates how the variable transimpedance dynamic range improves the power consumption. X axis represents the variable Tz dynamic range. There is no Tz dynamic range if Tz is fixed. Points on the X axis may be, for example, 3 dB, 6 dB, 9 dB, 12 dB and so on. The Y axis represents the power consumption of a linear amplifier. When the available variable Tz dynamic range is lower, the linear amplifier may operate at a higher supply voltage due to linearity requirements resulting in a higher power consumption. In that region, the power consumption may decrease at a low rate as the variable Tz dynamic range increases. However, above a threshold point where variable Tz dynamic range is sufficient to enable operation of linear amplifier from a lower power supply, the power consumption may drop significantly. Further increase in variable Tz dynamic range may result in reduction of power consumption at a low rate. An important aspect is that there is a break point that is the variable Tz dynamic range to enable lower power, and if a sufficient variable Tz dynamic range is available, a significant reduction in power may be obtained. Therefore, in one or more aspects, a dynamic range which is greater than the value of the break point is desirable. The break point occurs because the variable Tz dynamic range becomes sufficiently high that enables the linear amplifier to operate from the next lower available power supply. Supply voltages may be provided at discrete levels. In some examples, the supply voltages are provided in steps such as 5 volts (V), 3.3 V, and 1.8 V. Therefore, when the supply voltage is changed from 3.3 V to 1.8 V, a significant improvement to lower the power supply is achieved, however a corresponding increase in variable Tz dynamic range may be needed.

Therefore, Tz stage with a large variable Tz dynamic range for gain control may substantially reduce the input linear dynamic range of a linear amplifier. Having a larger Tz at a low end of the dynamic range (sensitivity) may reduce at least one stage of linear amplifier resulting in improved overall linearity and lower power. Having a reduced input linear dynamic range and reduced gain requirements may make variable gain linear amplifier design amenable to a low supply (e.g., 1.8 V) implementation for significant power savings. Therefore, one of the challenges is to achieve variable transimpedance value of a transimpedance amplifier that is amenable to high data rate applications, and in particular amenable to SiGe BiCMOS technology.

One approach to provide a variable Tz TIA is to vary the value of the feedback resistor of the transimpedance stage/amplifier by using FET switches. A FET switch allows the control and varying of the resistance of a switch by varying its gate voltage. The problem is that for high bandwidth and high data rate applications, a switch needs to have a relatively low capacitance. The input and the output nodes are critical to the performance of the transimpedance amplifier and FET switches add relatively large parasitic capacitance to those nodes. FET switches in a SiGe BiCMOS technology are poor in performance and typically cannot be used in a high speed data path. In addition, FET switches generally have a sharp transition from a high resistance value to a low resistance value, as the switch is turned on. In one or more aspects, it is desirable to have a well-controlled transition in resistance values. Some implementations provide a smooth transition from a high resistance value to a low resistance value. However, this implicates an additional penalty to the performance.

For BJT or Bi-CMOS transimpedance amplifier implementations according to one or more aspects of the present disclosure, as the data rates increase, a high performance transimpedance stage is achieved which may have a higher dynamic range of variable transimpedance and thereby allow a smaller dynamic range at the output of the transimpedance stage than the dynamic range at its input. The variable transimpedance stage/amplifier according to one or more aspects of the present disclosure may take a large input dynamic range and minimize the dynamic range requirements of the subsequent stages. Hence, the variable transimpedance stage/amplifier according to one or more aspects of the present disclosure can provide signals that are within a small dynamic range to the subsequent stages so that a linear stage may be implemented with low power.

One of the fundamental tradeoffs in designing the transimpedance stage is the selection of the transimpedance value, which is the feedback resistor value, i.e., the transimpedance of the shunt feedback amplifier. In one or more aspects, the selection of the transimpedance value, which is the feedback resistor value, is critical and this determined by this fundamental tradeoff between sensitivity requirements and dynamic range requirements. Sensitivity may refer to the ability of an amplifier to detect a signal which is significantly small. The smallest input signal level that can be detected may be referred to as sensitivity or a sensitivity state, and the large input dynamic range or the maximum input signal level that can be accommodated may be referred to as an overload or an overload state. These are the two ends of the input dynamic range, i.e., the sensitivity end and the overload end. At a sensitivity state, the input current (e.g., 106E or 306E) may be substantially small; and at an overload state, the input current (e.g., 106E or 306E) may be substantially high. The requirements at the two ends of the input dynamic range are often contradictory. For sensitivity, a large gain and hence a large transimpedance is required, and this is achieved with a large resistor Rf value. Additionally, to maximize the signal-to-noise ratio, a low noise amplifier is needed and low noise is also achieved by maximizing the resistor Rf value of the transimpedance amplifier. On the other hand, for overload, a small resistor value is required; otherwise, an extremely large signal and linearity issues may occur in subsequent stages. These are the fundamental opposing constraints on the feedback resistor value.

If a fixed transimpedance value is implemented for a transimpedance stage, either the sensitivity performance or the overload is sacrificed. Typically, an overload compliance (e.g., accommodating a maximum signal level) is required, and a substantially high power is applied to the associated circuit. This results in high power consumption, as high current amplifiers operating from high supply voltage levels are used in order to produce a working solution. In one or more aspects, for high data rate transmission in advanced applications, power consumption is a major concern, and one of the main challenges is reducing power consumption while maintaining the same high performance characteristics. Therefore, power requirements are becoming more demanding because performance requirements remain the same.

Figure 3:
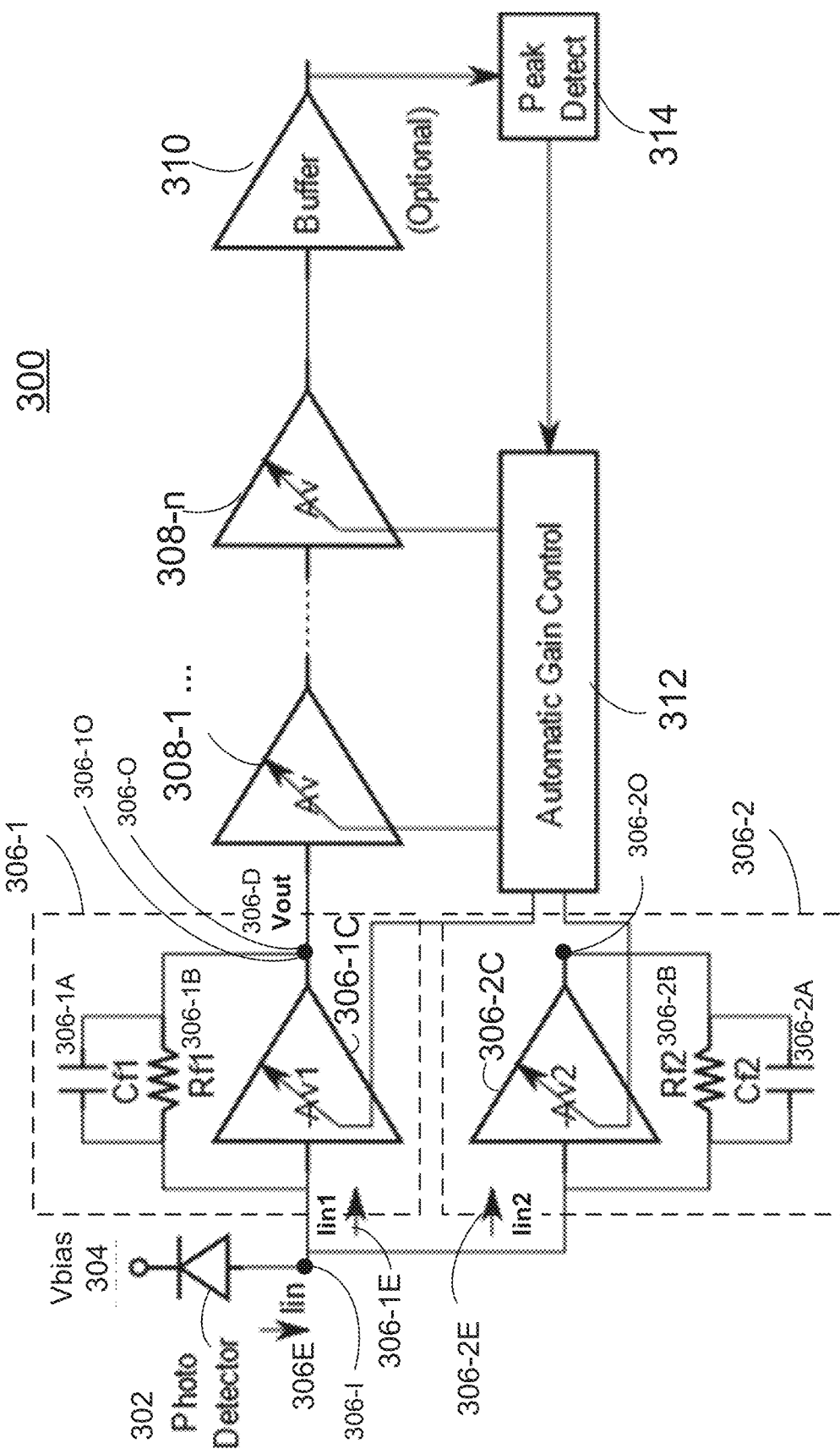
FIG. 3 illustrates a schematic diagram of an example of an optical receiver data path with a variable transimpedance amplifier/stage.

FIG. 3 illustrates a schematic diagram of an example of an optical receiver data path 300 with a variable transimpedance amplifier/stage under automatic gain control.

In FIG. 3, the optical receiver data path 300 used in an optical application may include a photo detector (or an optical receiver) 302. The photo detector 302 may connect to a node at a first end to receive a bias voltage 304 and connect to a variable transimpedance stage 306 at a second end. A variable transimpedance stage 306 may be sometimes referred to as a variable transimpedance amplifier 306, a variable transimpedance stage/amplifier 306, or a variable transimpedance amplifier/stage 306.

The subsequent stages 308-1 . . . to 308-$n$ after the variable transimpedance stage 306 may provide an additional variable gain so that there may be a number of variable gain stages to amplify the signal from the variable transimpedance stage 306. The signal may then be buffered by an optional buffer 310 for sending the buffered signal to a next block of circuits (not shown). In addition, the buffered signal may be provided to a peak detector 314, which may detect signal levels. An automatic gain control 312 may receive its input signal from the peak detector 314. The automatic gain control 312 is connected to each of the subsequent variable gain amplifier stages 108-1 . . . to 108-$n$ and also to the variable transimpedance stage 306.

The variable transimpedance stage 306 may have an input node 306-I and an output node 306-O. The input node 306-I may receive the input current 306E from the photo detector 302. The output node 306-O may produce an output voltage signal Vout to be provided to a subsequent circuit (e.g., 308-1).

The variable transimpedance stage 306 may include a first shunt feedback amplifier 306-1, which may include a feedback resistor Rf1 306-1B, a capacitor Cf1 306-1A, and an amplifier 306-1C having an inverting open loop forward voltage gain of −Av1. The variable transimpedance stage 306 may also include a second shunt feedback amplifier 306-2, which may include a feedback resistor Rf2 306-2B, a capacitor Cf2 306-2A, and an amplifier 306-2C having an inverting open loop forward voltage gain of −Av2.

In one or more examples, the amplifiers 306-1C and 306-2C include NPN BJTs and are configured to operate with variable gain.

The output voltage of the first shunt feedback amplifier 306-1 is the output voltage Vout 306-D of the variable transimpedance stage 306, which is to be provided to a circuit stage (e.g., 308-1) subsequent to the variable transimpedance stage 306. In one or more advantageous aspects, the output voltage of the second shunt feedback amplifier 306-2 is excluded from (or does not contribute to) the output voltage of the variable transimpedance stage 306, which is to be provided to the subsequent stage or circuit (e.g., 308-1) of the optical receiver data path.

In this regard, the output node 306-1O of the first shunt feedback amplifier 306-1 is connected to (or is directly connected to or is the same as) the output node 306O (for producing Vout 306-D) of the variable transimpedance stage 306. The output node 306-O of the variable transimpedance stage 306 is configured to drive the circuit (e.g., 308-1) subsequent to the variable transimpedance stage 306.

However, the output node 306-2O of the second shunt feedback amplifier 306-2 is not connected to (or is configured to be outside of or is not directly connected to) the output node 306-O of the variable transimpedance stage 306. The output node 306-2O of the second shunt feedback amplifier 306-2 is configured to be excluded from (or does not contribute to or does not participate in) driving the circuit (e.g., 308-1) subsequent to the variable transimpedance amplifier 306.

In some examples, the variable transimpedance stage 306 may be implemented independently and separately from the rest of the circuits in FIG. 3. In some other examples, the variable transimpedance stage 306 may be combined with other signal processing circuits (not shown). These are examples, and the subject technology is not limited thereto. The parameters of the variable transimpedance stage 306 may be represented and calculated as shown below under certain simplifying conditions, where the first shunt feedback includes the feedback resistor Rf1 306-1B and the capacitor Cf 306-1A, and the second shunt feedback includes the feedback resistor Rf2 306-2B and the capacitor Cf 306-2A:

Av (or $A_v$): Maximum open loop forward voltage gain of either of the amplifiers 306-1C and 306-2C (without the first and second shunt feedbacks); or the maximum open loop forward voltage gain of the variable transimpedance stage 306 (without the first and second shunt feedbacks)

X: Scaling factor with a range of 1 to 0.5 representing gain control in one example configuration Av1 (or $A_{v1}$): Scaled open loop forward voltage gain of the amplifier 306-1C (without the first shunt feedback)

Av2 (or $A_{v2}$): Scaled open loop forward voltage gain of the amplifier 306-2C (without the second shunt feedback)

Rf1 (or $R_{f1}$): Resistance of the feedback resistor Rf1 306-1B

Rf2 (or $R_{f2}$): Resistance of the feedback resistor Rf2 306-2B

Rin1 (or $R_{in1}$): Input impedance of the first shunt feedback amplifier 306-1 (with the first shunt feedback)

Rin2 (or $R_{in2}$): Input impedance of second shunt feedback amplifier 306-2 (with the second shunt feedback)

RinX (or $R_{inX}$): Effective input impedance of the two parallel shunt feedback amplifiers 306-1 and 306-2 (with the first and second shunt feedbacks); or the effective input impedance of the variable transimpedance stage 306 (with the first and second shunt feedbacks)

Tzx (or TzX or $T_{zX}$): Effective transimpedance (Vout/Iin) of the two parallel shunt feedback amplifiers 306-1 and 306-2 for a certain X (with the first and second shunt feedbacks); or the effective transimpedance of the variable transimpedance stage 306 (with the first and second shunt feedbacks)

$$A_{v1} = XA_v; D: \{X \mid 0.5 \leq X \leq 1\}$$

$$A_{v2} = (1-X)A_v$$

$$R_{in1} = \frac{R_{f1}}{1+A_{v1}}$$

$$R_{in2} = \frac{R_{f2}}{1+A_{v2}}$$

$$R_{inX} = \frac{R_{in1}R_{in2}}{R_{in1}+R_{in2}} \approx \frac{R_{f1}R_{f2}}{A_v(R_{f1}(1-X)+R_{f2}X)}$$

$$T_{zX} \approx -\frac{XR_{f1}R_{f2}}{(1-X)R_{f1}+XR_{f2}}$$

$$T_{zX} \approx -\frac{XR_{f1}}{(1-X)R_{f1}/R_{f2}+X}$$

The gains Av1 and Av2 are related to one another and are variable. In one or more advantageous aspects, the variable gains allow the variable transimpedance stage 306 to achieve a variable transimpedance Tz. In one aspect, the variable gain Av2 of the second shunt feedback amplifier 306-2 enables the variable transimpedance stage 306 to produce a variable transimpedance Tz. The variable gain Av2 may be directly controlled by the automatic gain control 312 fed back from the subsequent circuits. The variable gain Av1 may be directly or indirectly controlled by the automatic gain control 312 fed back from the subsequent circuits. The amplifier 306-2C may have an open loop voltage gain Av2 matching the open loop voltage gain Av1 of the amplifier 306-1C under an example maximum Tz attenuation condition (e.g., X=0.5, or a minimum Tz). In some examples, X may be between 0 to 1. Herein, maximum and minimum may be examples for a sample configuration.

In some examples, the following equations $$T_{zX} \approx -\frac{XR_{f1}R_{f2}}{(1-X)R_{f1}+XR_{f2}}$$

$$T_{zX} \approx -\frac{XR_{f1}}{(1-X)R_{f1}/R_{f2}+X}$$

may represent an approximate value of TzX under simplified conditions where Av is sufficiently large as X approaches 0.5.

In one or more aspects, an open loop forward voltage gain may be sometimes referred to as an open loop gain, an open loop forward gain, a forward gain, or a forward voltage gain. In one or more aspects, a scaled open loop forward voltage gain may be sometimes referred to as an open loop gain, an open loop forward gain, a forward gain, or a forward voltage gain. In one or more aspects, a maximum open loop forward voltage gain may be sometimes referred to as a maximum open loop gain, a maximum open loop forward gain, a maximum forward gain, or a maximum forward voltage gain. In one or more aspects, an open loop forward voltage gain, a scaled open loop forward voltage gain, a maximum open loop forward voltage gain, and the like may sometimes refer to an absolute value of an open loop forward voltage gain, an absolute value of a scaled open loop forward voltage gain, an absolute value of a maximum open loop forward voltage gain, and an absolute value of the like, respectively.

In one or more aspects, a transimpedance of the variable transimpedance stage 306 may be the output voltage (e.g., Vout 306-D) of the variable transimpedance stage 306 divided by the input current (e.g., Iin 306E) of the variable transimpedance stage 306.

In one or more advantageous aspects, as shown in FIG. 3, a variable transimpedance amplifier 306 may include two parallel shunt feedback amplifiers 306-1 and 306-2 with fixed resistor values of Rf1 and Rf2, respectively. The variable transimpedance amplifier 306 configuration having fixed resistor values may advantageously avoid the need for FET switches to vary Rf1 or Rf2 in BJT/Bi-CMOS implementations. In one or more advantageous aspects, Rf1 and Rf2 have fixed values. In this regard, Rf1 and Rf2 do not include FET switches. In one or more advantageous aspects, Rf1 and Rf2 have fixed values that do not vary as the input signal (e.g., the input current 306E) of the variable transimpedance amplifier 306 changes. Thus, Rf1 and Rf2 may be constant over the range of input current (Iin 306E) of the variable transimpedance amplifier 306.

In one or more advantageous aspects, only the forward gain (or the open loop forward voltage gain) of each of the amplifiers 306-1C and 306-2C needs to be varied. In one or more advantageous aspects, this is achievable in BJT/Bi-CMOS implementation with only BJTs being present in the high speed signal path without any FET switches in the high speed signal path, as FET switches may degrade the high speed signal path performance. In this example, the variable transimpedance stage 306 includes BJTs without FET switches.

In one or more advantageous aspects, the open loop forward voltage gains of the amplifiers 306-1C and 306-2C may be configured to vary in opposite directions as the input signal (e.g., the input current 306E) of the variable transimpedance amplifier 306 is changed. For example, as the input current changes from a low level to a high level (or from a sensitivity state to an overload state), the open loop forward voltage gain Av1 (or the absolute value of Av1) of the amplifier 306-1C may decrease, and the open loop forward voltage gain Av2 (or the absolute value of Av2) of the amplifier 306-2C may increase. In some examples, the open loop forward voltage gain Av1 may be fixed.

In some examples, X may be 1 (or close to 1) for a low input current level (a sensitivity state), and X may be 0.5 (or close to 0.5) for a high input current level (an overload state). Hence, as the input current 306E changes from a low level (a sensitivity state) to a high level (an overload state), Av1 may change from a first high gain (e.g., X=1, and Av1=Av or close to Av) to a first low gain (e.g., X=0.5, and Av1=0.5*Av or close to 0.5*Av). At the same time, Av2 may change from a second low gain (e.g., X=1, and Av2=0 or close to 0) to a second high gain (e.g., X=0.5, and Av2=0.5*Av or close to 0.5*Av). In these examples, the first high gain of Av1 is higher than the second low gain of Av2, and the first low gain of Av1 may be the same or substantially the same as the second high gain of Av2. In another example configuration Av1 may be decreased while Av2 is increased but either one or both Av1 and Av2 may not scale linearly with X.

In the above examples, when the input current 306E is at a low level (a sensitivity state), the amplifier 306-1 may receive substantially all of the input current 306E (e.g., Iin1 is close to 100% of Iin), and the amplifier 306-2 may receive substantially no input current 306E (e.g., Iin2 is close to zero, or close to 0% of Iin). When the input current 306E is at a high level (or an overload state), the input current 306E may be split in proportion to the Tz attenuation. In one example, for Tz attenuation of 0.25 or 12 dB, Iin1 may be about 25% of Iin, and Iin2 may be about 75% of Iin. In another example, for Tz attenuation of 0.5 or 6 dB, Iin1 may be about 50% of Iin, and Iin2 may be about 50% of Iin. Therefore, the fraction (or the percentage) of the input current 306E flowing to the amplifier 306-1 at a sensitivity state is substantially higher than the fraction of the input current 306E flowing to the amplifier 306-1 at an overload state.

Furthermore, the fraction (or the percentage) of the input current 306E flowing to the amplifier 306-2 at a sensitivity state may be substantially lower than the fraction of the input current 306E flowing to the amplifier 306-2 at an overload state. Thus, the fraction (or the percentage) of the input current 306E flowing into each of the amplifiers 306-1 and 306-2 may vary based on the input current 306E and corresponding Tz attenuation applied through gain control.

Furthermore, Rin2 (e.g., Rf2/(1+Av2)) at a sensitivity state may be substantially higher than Rin2 at an overload state because Av2 at a sensitivity state may be lower (or substantially 0) than Av2 at an overload state. In addition, Rin2 (e.g., Rf2/(1+Av2)) at a sensitivity state may be substantially higher than Rin1 (e.g., Rf1/(1+Av1)) at the sensitivity state because Av2 at a sensitivity state may be substantially lower than Av1 at a sensitivity state. Thus, Rin2 may vary based on the input current 306E and corresponding Tz attenuation applied through gain control.

In one or more advantageous aspects, the net transimpedance of the variable transimpedance stage 306 may be simply a function of the scaling factor X and Rf1 and Rf2 as X approaches 0.5. It may be independent of the maximum open loop gain Av of the amplifiers 306-1C and 306-2C in the shunt feedback amplifiers 306-1 and 306-2, provided that the open loop gain Av is sufficiently high. A sufficiently high Av may be, for example, when 0.5*Av is much greater than 1, such that 1+0.5*Av is substantially 0.5*Av. This results in an effective transimpedance at the maximum Tz attenuation (or minimum Tz) state that is more stable over the fabrication process variations and operating condition variations (for example, temperature).

In one or more advantageous aspects, the effective input impedance (RinX) may remain substantially the same over the variable Tz dynamic range for the case where Rf2=Rf1. For the case where Rf2<Rf1, the effective input impedance (RinX) may decrease with Tz attenuation, whereas for the case Rf2>Rf1, the effective input impedance (RinX) may increase with Tz attenuation. However, the percentage change in RinX may be substantially smaller over the variable Tz dynamic range than the percentage change in Tv attenuation factor. This is desirable for stabilizing the high frequency response of the variable Tz stage which can be a limiting factor in other approaches to the achievable dynamic range of variable Tz and therefore constraining the power consumption to a higher value. In one or more examples, an input impedance may be referred to as an input resistance for the low frequency or DC case.

In FIG. 3, in the sensitivity stage, the gain of the amplifier 306-2C in the second shunt feedback amplifier 306-2 is zero, where the gain in the second shunt feedback amplifier 306-2 may be controlled by the automatic gain control 312. The impedance presented by this second path (or the second shunt feedback amplifier 306-2 path) is substantially Rf2 306-2B since the output impedance of the open loop inverting amplifier 306-2C is substantially lower than Rf2. In this state, most of the input current Iin 306E flows through the first shunt feedback amplifier 306-1 path, however, some current is shunted away from first shunt feedback amplifier 306-1 path into Rf2 effectively reducing Tz and increasing noise referred at the input. To achieve low noise and good sensitivity, when the input signal is small, the transimpedance is desired to be maximized, and substantially all of the current 306E from the photo detector 302 used to generate an output signal Vout. In this case, it is undesirable for the useful input signal current 306E to be shunted away into Rf2 of the second shunt feedback amplifier 306-2. To avoid the shunting of input signal into Rf2 when the gain is set to zero (or close to zero) in the second shunt feedback amplifier 306-2, the second shunt feedback amplifier 306-2C is configured to present a high output impedance such that the shunt path through Rf2 to output of 306-2C is a high impedance, which is substantially higher than input impedance of first shunt feedback amplifier Rin1. This minimizes shunting of input current 306E in sensitivity state and minimizes noise contribution from Rf2 in the sensitivity stage. Therefore, low noise and high transimpedance may be achieved to minimize impact of second shunt feedback amplifier path on the sensitivity performance.

As the input signal increases and the system approaches overload, the output signal amplitude may become excessively large. When the output signal amplitude becomes exceedingly large for the subsequent stages, higher power may be needed in the subsequent stages, which is undesirable. In one or more advantageous aspects, as the input signal increases, the second path gain of the second shunt feedback amplifier 306-2 is configured to increase under automatic gain control 312. As the gain of the second path increases, the input impedance presented by the second path, at the input of the second shunt feedback amplifier 306-2, reduces accordingly. As described above, the input impedance of the second shunt feedback amplifier 306-2 may be defined as $Rf2/(1+Av2)$. In this example configuration, Av2 is no longer zero, and it may increase to a value that is equal to Av1 eventually, and that is the limit defined by the equations shown above with respect to FIG. 3. At that limit, the gains of the first path (i.e., the first shunt feedback amplifier 306-1 path) and the second path (i.e., the second shunt feedback amplifier 306-2 path) are scaled by scaling factors X and (1−X), respectively, and the gains in the first path and the second path are X*Av and (1−X)*Av, respectively, where Av is the maximum open loop forward gain that can be achieved (or achievable) by either of these open loop amplifiers 306-1C and 306-2C. In one or more aspects, when the gains (Av1 and Av2) of the two amplifiers 306-1C and 306-2C are the same, each of the amplifiers can have at most a gain of 0.5*Av.

In some examples, to maximize sensitivity, Av2 is 0, X is equal to 1, and Av1 is equal to Av. In that case, Rin1 has a small value because Av1 is large, Rin2 has a large value because Av2 is 0, and all or substantially all of the input current 306E flows into the first shunt feedback amplifier 306-1.

As overload is approached, in one or more advantageous aspects, the scaling factor X may be reduced (e.g., down to 0.5), where 0.5 may be the practical minimum value that is advantageous in this configuration. In one or more aspects, the maximum dynamic range for the transimpedance stage 306 may be achieved when the scaling factor X is 0. However, as X approaches 0, the forward gain Av1 approaches (which can distort input signal and increase the sensitivity of variable Tz dynamic range to fabrication process variations and operating conditions (e.g., temperature). A sufficiently large dynamic range of variable Tz can be achieved with appropriate selection of Rf1 and Rf2 values and keeping X=0.5 as the minimum value. In that case, Av1 is equal to half of Av, and Av2 is also equal to half of Av. That means the forward gain in the first path is reduced, and the forward gain in the second path is increased. In a simple case, where Rf2 is equal to Rf1, Rin2 is equal to Rin1. There are two low impedance paths, each with the same impedance, presented to the photocurrent 306E flowing from the photo detector 302. As a consequence, half the signal is shunted over to the second path of the second shunt feedback amplifier 306-2. By shunting that half the signal over to the second path, the signal that appears at the output of the transimpedance stage 306 is half the value of what it would normally be (i.e., half the output signal of the transimpedance stage 106, which does not have a second shunt feedback amplifier). Therefore, a desirable dynamic range is achieved for the variable transimpedance TX. In above example, a dynamic range of 6 dB is achieved, and only half the signal appears at the output of the transimpedance stage 306. In another example case, where Rf2 is equal to ⅓ of Rf1 and minimum X=0.5, a dynamic range of 12 dB is achieved for variable transimpedance TzX. This significantly lowers the power needed by the subsequent stages, especially by the subsequent variable gain linear amplifier (e.g., 308-1) by reducing the linear dynamic range of signal applied at its input. In one or more advantageous aspects, the variable transimpedance may be achieved without varying the values of any resistors (e.g., Rf1 and Rf2) in any of the feedback amplifiers (e.g., 306-1 and 306-2), but rather by varying the gain Av2 of the amplifier 306-2C and the gain Av1 of the amplifier 306-1C.

In one or more advantageous aspects, at the maximum transimpedance state (X=1) (or at a sensitivity state), it is desirable to avoid loading the input (e.g., the input node 306-I) of the transimpedance stage 306 with the second shunt feedback amplifier 306-2. In this state, the input impedance (Rin2=Rf2) of the second shunt feedback amplifier 306-2 is substantially higher than the input impedance Rin1 (i.e., $Rf1/(1+Av1)$) of the first shunt feedback amplifier 306-1. However, ideally Rin2 may be set to be substantially higher than Rf2 to avoid noise from Rf2 degrading the sensitivity performance. This may be achieved with a further refinement to the second inverting amplifier 306-2C where its output is placed into a high impedance state for the case where X=1 and Av2=0. As a result, Rin2 may be equal to Rf2+Rout of the second inverting amplifier 306-2C, where Rout of the second inverting amplifier is substantially higher than Rf2, thereby minimizing the noise contribution to sensitivity. In this example, Rout may refer to an output impedance.

In some example implementations, the output impedance of the second shunt feedback amplifier 306-2 is varied. With reference to FIG. 3, when an amplifier is assumed to be ideal, the ideal amplifier may have a high input impedance (e.g., close to an infinite input impedance) and a low output impedance (e.g., close to a zero output impedance). In practical implementation, the output impedance of the second inverting amplifier 306-2C is not zero, but is sufficiently lower than the practical values of Rf2 such that in the sensitivity state, where Av2=0, the output impedance of second amplifier may be substantially lower than Rf2, thereby loading the input which is undesirable. Placing the second inverting amplifier output impedance/resistance to a high state when Av2=0 may solve this issue. When a high output impedance state is achieved, the input impedance of the second shunt feedback amplifier 306-2 may be Rf2 in series with high output impedance of second amplifier. In series with this high output impedance, the second shunt feedback amplifier 306-2 is effectively open. As a result, almost no current flows into the second path (i.e., the second shunt feedback amplifier 306-2 path). This can advantageously improve the sensitivity performance.

In one or more advantageous aspects, it is desirable to avoid the second inverting amplifier 306-2C's input capacitance loading the input (e.g., the input node 306-I) as high input capacitance degrades the transimpedance amplifier's transfer function over frequency and results in higher input referred noise. In one or more implementations, the input capacitance due to the second inverting amplifier 306-2C is avoided by sharing an input BJT device (for example, Q0 in FIG. 6) between the two gain paths as illustrated further in FIG. 6.

In the simple case where Rf1 is equal to Rf2, a dynamic range for the variable transimpedance is, for example, about 6 dB. However, the optical signal may have up to 30 dB dynamic range in the voltage domain. It is desirable to increase the dynamic range of the variable transimpedance stage 306 as much as possible. In one or more aspects, this may be achieved if a smaller fixed value of Rf2 306-2B is chosen. For example, a dynamic range of up to 12 dB may be achieved by reducing Rf2 from Rf1 to ⅓ of Rf1 for a minimum X=0.5. A considerably small value of Rf2 comparable to ⅓ of Rf1/(1+Av) may not be needed. The value of Rf2 may be in the same order comparable to the Rf1 value, and this still allows the transimpedance stage 306 to have a relatively large dynamic range for the transimpedance. The foregoing values and ranges are examples, and the subject technology is not limited thereto.

Figure 4:
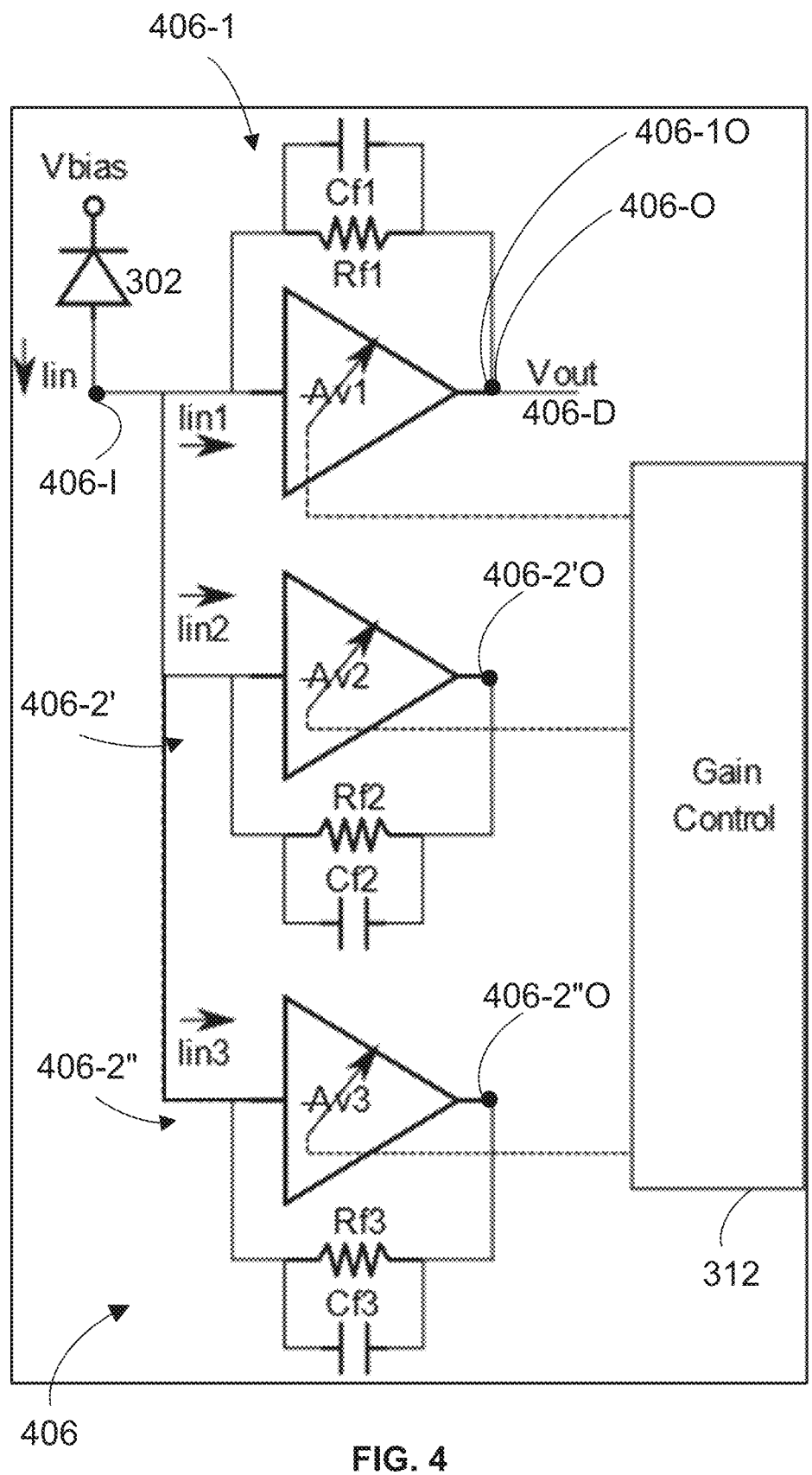
FIG. 4 illustrates a schematic diagram of an example of circuits including a variable transimpedance amplifier/stage with three shunt feedback amplifiers.

FIG. 4 illustrates a schematic diagram of an example of circuits including a variable transimpedance amplifier/stage with three shunt feedback amplifiers.

In this example, the variable transimpedance amplifier/stage 306 of FIG. 3 may be replaced with the variable transimpedance amplifier/stage 406 of FIG. 4.

For a large dynamic range operation, the variable transimpedance amplifier/stage 406 may include three parallel shunt feedback amplifiers 406-1, 406-2', and 406-2" (having open loop gains of −Av1, −Av2 and −Av3, respectively, as shown in FIG. 4). The first inverting amplifier 406-1 of the three shunt feedback amplifiers may have the same or substantially the same structures and functions as the first shunt feedback amplifier 306-1 shown in FIG. 3. Each of the second inverting amplifier 406-2' and the third amplifier 406-2" of the three shunt feedback amplifiers may have the same or substantially the same structures as the second shunt feedback amplifier 306-2 shown in FIG. 3. In one or more aspects, the second inverting amplifier 406-2' and the third amplifier 406-2" may operate in the same or in a similar manner as the second shunt feedback amplifier 306-2, except that the functions of the second shunt feedback amplifier 306-2 are carried out by two amplifiers 406-2' and 406-2". Therefore, the detailed descriptions regarding the amplifiers 406-1, 406-2' and 406-2" may be omitted for brevity.

The first shunt feedback amplifier 406-1 may include a feedback resistor Rf1, a capacitor Cf1, and an amplifier with an open loop gain of −Av1. The second shunt feedback amplifier 406-2' may include a feedback resistor Rf2, a capacitor Cf2, and an amplifier with an open loop gain of −Av2. The third shunt feedback amplifier 406-2" may include a feedback resistor Rf3, a capacitor Cf3, and an amplifier with an open loop gain of −Av3. Rf3 may be connected in parallel with the amplifier with an open loop gain of −Av3. Cf3 may be connected in parallel with Rf3 and the amplifier with an open loop gain of −Av3. The amplifiers 406-1, 406-2' and 406-2" may be connected to an input node 406-I in parallel.

In FIG. 4, the output voltage Vout of the first shunt feedback amplifier is the output voltage Vout 406-D of the variable transimpedance stage 406, which may be provided to the subsequent stage/circuit (e.g., 308-1) of the operational circuits. The output voltages of the second and third feedback amplifiers are excluded from the output voltage Vout of the variable transimpedance stage 406, which may be provided to the subsequent stage/circuit (e.g., 308-1) of the operational circuits.

In this regard, the output node 406-1O of the first shunt feedback amplifier 406-1 is connected to (or is directly connected to or is the same as) the output node 406-O (for producing Vout 406-D) of the variable transimpedance stage 406. The output node 406-O of the variable transimpedance stage 406 is configured to drive the circuit (e.g., 308-1) subsequent to the variable transimpedance stage 406.

However, the output nodes 406-2'O and 406-2"O of the second and third shunt feedback amplifiers 406-2' and 406-2" are not connected to (or are configured to be outside of or are not directly connected to) the output node 406-O of the variable transimpedance stage 406. The output nodes 406-2'O and 406-2"O are configured to be excluded from (or do not contribute to or do not participate in) driving the circuit (e.g., 308-1) subsequent to the variable transimpedance amplifier 406.

In one or more examples, a primary amplifier may refer to the amplifier 306-1 or 406-1. In one or more examples, one or more secondary amplifiers may refer to the amplifier 306-2 or the amplifiers 406-2' and 406-2".

In some exemplary implementations of the present disclosure, multiple shunt feedback amplifiers (e.g., n parallel shunt feedback amplifiers where n is a positive integer greater than one) may be implemented to achieve a high dynamic range for Tz.

Figure 5:
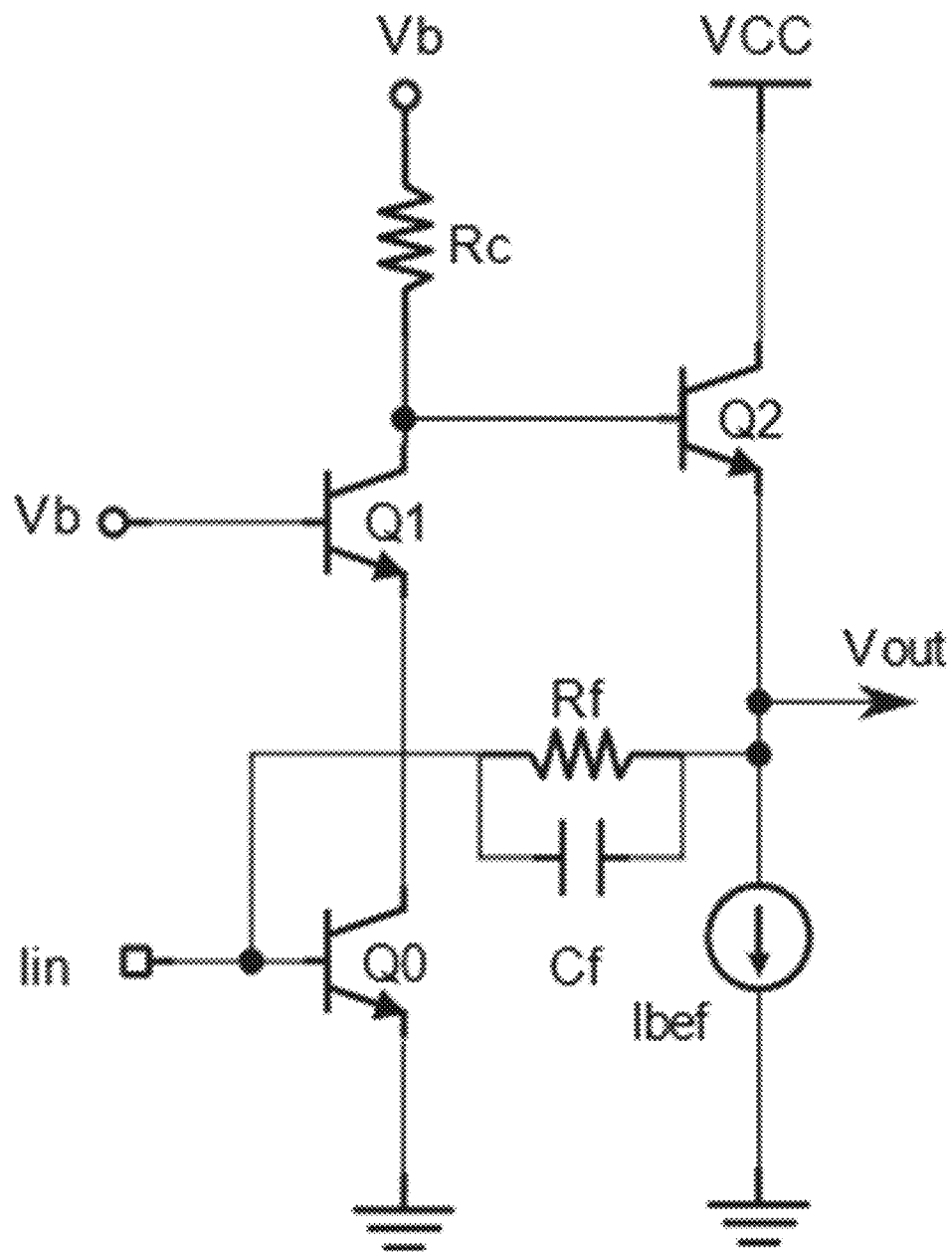
FIG. 5 illustrates a circuit diagram of an example of a fixed transimpedance amplifier.

FIG. 5 illustrates a schematic diagram of an example of a fixed transimpedance amplifier using BJTs.

In this example, the transimpedance stage 106 of FIG. 1 may be implemented with the fixed transimpedance amplifier 500. In an implementation of a Bi-CMOS transimpedance amplifier, a fixed transimpedance amplifier 500 may include transistors Q0, Q1, and Q2 and it may have a feedback path using a resistor Rf and a capacitor Cf. Each of Q0, Q1, and Q2 may be an NPN BJT. The emitter of the transistor Q0 may be connected to the ground and the collector of the transistor Q0 may be connected to the emitter of the transistor Q1. The base of the transistor Q0 may be connected to a node to receive the input current Iin, to one side of the parallel resistor Rf, and to one side of capacitor Cf. The base of the transistor Q1 may be controlled by a gain control voltage Vb. The collector of the transistor Q1 may be connected to a load resistor Rc, which receives a bias voltage Vb, and to a base of the transistor Q2. The collector of the transistor Q2 may be connected to a node to receive a supply voltage VCC. The emitter of the transistor Q2 may be connected to the output voltage node for the output voltage Vout that is provided to the subsequent stages of the circuits, to another side of the parallel resistor Rf and capacitor Cf, and to a current source Ibef which may be connected to the ground.

The parameters of the fixed transimpedance stage/amplifier 500 may be represented and calculated as shown below:
  Av: Open loop forward voltage gain of the fixed transimpedance amplifier gm0 (or $g_{m0}$): Small signal transconductance parameter of the device Q0 gm2 (or $g_{m2}$): Small signal transconductance parameter of the device Q2

Rc: Resistance of the load resistor Rc

Rf (or $R_f$): Resistance of the resistor Rf

Rin (or $R_{in}$): Input impedance of the fixed transimpedance amplifier $\overline{V_{ni_A}^2}$: Input referred voltage noise of the open loop amplifier constituting Q0, Q1, Rc, Q2 (without shunt feedback)

$\overline{I_{n_{in}}^2}$: Input referred noise for the fixed transimpedance amplifier $$A_v = \frac{-g_{m0}R_c g_{m2}R_f + 1}{1 + g_{m2}R_f} \approx -g_{m0}R_c$$

$$T_z = -\frac{A_v}{1+A_v}R_f$$

$$R_{in} = \frac{R_f}{1+A_v}$$

$$\overline{I_{n_{in}}^2} = \frac{4kT}{R_f} + \frac{\overline{V_{ni_A}^2}}{R_f^2}$$

Figure 6:
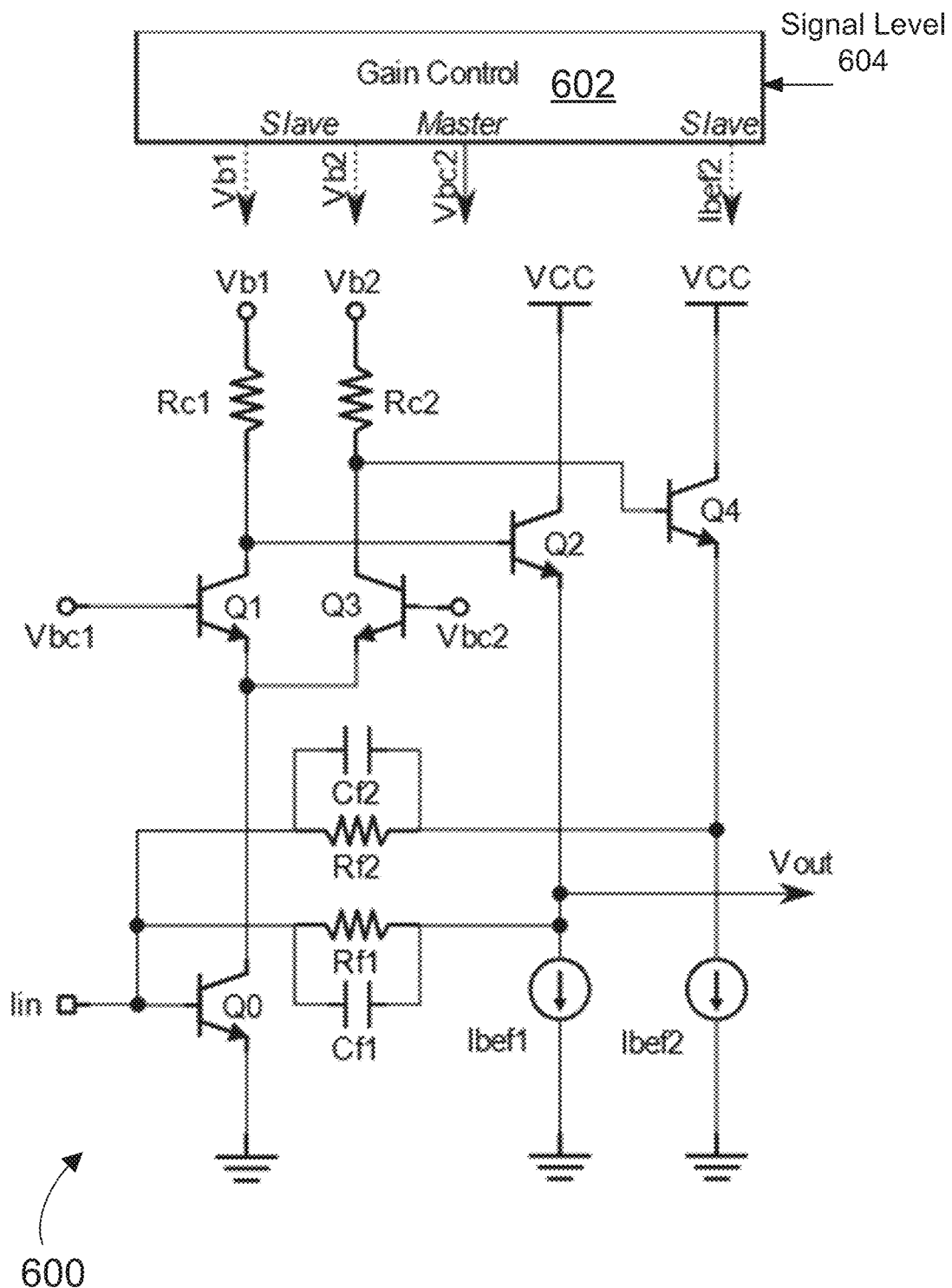
FIG. 6 illustrates a circuit diagram of an example of a variable transimpedance amplifier/stage.

FIG. 6 illustrates a circuit diagram of an example of a variable transimpedance amplifier/stage 600 using BJTs. The variable transimpedance amplifier/stage 600 may be implemented as the variable transimpedance stage 306 in FIG. 3 or implemented with one or more other signal processing circuits. In some examples, the BJTs may be manufactured using Bi-CMOS process. The first shunt feedback amplifier 306-1 may include transistors Q0, Q1, and Q2 and a current source Ibef1. The first shunt feedback amplifier 306-1 may have a feedback path including a resistor Rf1 and a capacitor Cf1. Each of Q0, Q1, and Q2 may be an NPN BJT. The emitter of the transistor Q0 may be connected to the ground and the collector of the transistor Q0 may be connected to the emitter of the transistor Q1. The base of the transistor Q0 may be connected to a node to receive the input current Iin and to one side of the parallel resistor Rf1 and capacitor Cf1. The base of the transistor Q1 may be controlled by a bias voltage Vbc1. The collector of the transistor Q1 may be connected to a load resistor Rc1, which may be connected to a node for receiving a bias voltage Vb1 and to a base of the transistor Q2. The collector of the transistor Q2 may be connected to a supply voltage VCC. The emitter of the transistor Q2 may be connected to the output voltage node for producing an output voltage Vout that is to be provided to the subsequent stages of the circuits (e.g., 308-1 to 308-*n* and 310 in FIG. 3), to another side of the parallel resistor Rf1 and capacitor Cf1, and to the current source Ibef1 which may be connected to the ground. In one or more examples, a supply voltage VCC may be an example of a supply voltage, and the ground may be another example of a supply voltage.

The second shunt feedback amplifier 306-2 shown in FIG. 3 may include transistors Q0, Q3, and Q4 and a current source Ibef2. The second shunt feedback amplifier 306-2 may have a feedback path including a resistor Rf2 and a capacitor Cf2. The transistor Q0 is shared by the first and second shunt feedback amplifiers 306-1 and 306-2. Each of Q0, Q3, and Q4 may be an NPN BJT. The collector of the transistor Q0 may be connected to the emitter of the transistor Q3. The base of the transistor Q0 may be connected to one side of the parallel resistor Rf2 and capacitor Cf2. The base of the transistor Q3 may be controlled by a gain control voltage Vbc2. The connector of the transistor Q3 may be connected to a load resistor Rc2, which receives a bias voltage Vb2, and to a base of the transistor Q4. The collector of the transistor Q4 may be connected to a node to receive a supply voltage VCC. The emitter of the transistor Q4 may be connected to another side of the parallel resistor Rf2 and capacitor Cf2, and to a current source Ibef2 which may be connected to the ground.

The parameters of the variable transimpedance stage/amplifier 600 may be represented and calculated as per parameters for 306 with the open loop amplifier gain parameters given by:

$$A_v \approx -g_{m0}R_c$$

$$A_{v1} \approx -Xg_{m0}R_c$$

$$A_{v2} \approx -(1-X)g_{m0}R_c$$

$$X = \frac{g_{m1}}{g_{m1} + g_{m3}}$$

Where:

gm0 (or $g_{m0}$): Small signal transconductance parameter of the device Q0 gm1 (or $g_{m1}$): Small signal transconductance parameter of the device Q1 gm3 (or $g_{m3}$): Small signal transconductance parameter of the device Q3

Rc: Resistance of the load resistor for the case Rc1=Rc2

X: Scaling factor under gain control

In some examples, the scaling factor X for the open loop amplifier gain may be determined by the ratio of gm1 to the sum of gm1 and gm3. The transconductances gm1 and gm3 are a function of the bias currents through Q1 and Q3 respectively at a given bias point of the transimpedance amplifier. The bias currents through Q1 and Q3 in turn are under gain control and determine scaling factor X primarily through control of Vbc2 and secondarily through Vb1 and Vb2. Av or the maximum open loop gain for the case X=1 is determined by the bias Vb1 which defines the bias current through Q1 and hence Q0 and gm0.

In one or more advantageous aspects, the resistors Rf1 and Rf2 may be fixed (or have fixed resistance values). Instead, the open loop forward voltage gain Av1 for the first shunt feedback amplifier 306-1 and Av2 for the second shunt feedback amplifier 306-2 given above may be placed under gain control to vary the Tz. The open loop gain for the first shunt feedback amplifier 306-1 may be varied by changing Vb1 which changes the bias current for Q1 and Q0 and hence transconductance gm1 and gm0. The open loop forward voltage gain Av2 for the second shunt feedback amplifier 306-2 may be varied by changing the bias current and hence the transconductance gm3 of the transistor Q3 through the base bias voltage Vbc2. In one example configuration, as Vbc2 is increased to increase Av2, Vb1 is decreased to decrease Av1 such that gm0) is kept constant and gm0=gm1+gm3. In this example case, Av1 and Av2 scale linearly with scaling factor X. In another example configuration Av1 may be decreased while Av2 is increased but either one or both Av1 and Av2 may not scale linearly with X.

To maximize sensitivity performance, in one more advantageous aspects, the base bias voltage Vbc2, under a gain control 602, may be set to a value lower than Vbc1, and the current path though Q3 to Rc2 and Vb2 in this situation is essentially off. There is essentially no current flowing through Q3. Consequently, all of the current flows through Q1, and the path through Q1 to Rc1 and Vb1 has the highest gain Av1 close to Av, and the scaling factor is equal or close to 1. Furthermore, the gain (e.g., Av1) is a function of the current flowing through Q1 and Q0. The first shunt feedback amplifier 306-1, including Q0, Q1, and Q2, presents a high gain path to the output node for Vout and across the register Rf1, and has a low input resistance Rin1, which is Rf1 divided by one plus the gain of the amplifier. That is, Rin1=Rf1/(1+Av1), as described with reference to FIG. 3.

In the sensitivity state, to maximize sensitivity performance, in one more advantageous aspects, a zero gain and a high output impedance in the second shunt feedback amplifier 306-2 may be desired. Using the gain control vbc2 the current through Q3 may be reduced to effectively zero, as well as forcing the bias voltage Vb2 to be low, and Ibef2 to a very small value. Q4 emitter node may be placed into a high impedance stage. The gain control 602 such as the automatic gain control 312 may be employed to vary the bias voltage Vb2 such that, as the gain control 602 reduces Vbc2, and as the scaling factor X approaches 1, not only Vbc2 is lowered, but also Vb2 is lowered and Ibef2 may be also reduced and this may force Q4 to shut off. Therefore, as Vbc2 is reduced as the master control, Vb2 and Ibef2 are also reduced which are slaved to the master control. All of those changes may place the input of the second shunt feedback amplifier 306-2 into a high impedance state, which includes Rf2 in series with the high impedance at Q4 emitter. As a consequence, no significant current flows through the second shunt feedback amplifier 306-2. In one or more aspects, the gain control 602 primarily controls Vbc2, and as a secondary control, the gain control 602 adjusts not only Vb2 and Ibef2 but also Vb1. When Vbc2 is reduced, Vb1 may be increased as it is slaved to the gain control of Vbc2. Vb1 may be set to a value so that a desired current may flow through the first shunt feedback amplifier 306-1, including Q1 and Q0. In some examples. Vb1 may be (instead of being a constant bias voltage) controlled (or varied) to force a variable current through Q1 and Q0. In some examples, the gain control 602 may use an input signal level 604. The input signal level 604 may be, for example, received from the peak detector 314.

To reduce the transimpedance and achieve a variable transimpedance, in one or more advantageous aspects, the gain control may first increase Ibef2 so as to bring Q4 out of high impedance state in concert Vb2 and achieve a lower impedance at emitter of Q4 and a low output impedance of second open loop amplifier to enable Rf2 to shunt the first shunt feedback amplifier, thereby reducing effective Tz slightly. The gain control may next increase the base control voltage Vbc2 for Q3, e.g., up until the point where Vbc2 is equal to Vbc1. When Vbc2 is equal to Vbc1, the scaling factor X is equal to 0.5, and the transimpedance amplifier is in overload state. At that equilibrium point, the currents through Q1 and Q3 are the same. Further, the forward voltage gains, e.g., Av1 and Av2, may be equal as Rc2 may be equal to Rc1 and Vb2 may be equal to Vb1. When Rf1 is equal to Rf2, equal signals (e.g., currents) may flow through Q2 and Q4 and may be presented at the output of each of the amplifiers across the two feedback resistors Rf1 and Rf2. An equal low impedance path may be formed by each of Rf1 and Rf2, and the input current Iin may be shunted equally between these two paths. This may reduce the transimpedance effectively by 6 dB and provide a 6 dB variable transimpedance dynamic range. The foregoing values are examples, and the subject technology is not limited thereto. In some examples, under the same condition, if Rf2 is reduced below the value of Rf1, a larger dynamic range can be achieved for this variable transimpedance amplifier 600. As the input signal increases (i.e., the input current Iin increases), Vbc2 may be also increased by the gain control 602. When Vbc2 is increased, Ibef2 may be increased first and Vb2 may be increased in proportion to increase Av2, while Vb1 may be reduced in proportion to decrease Av1 under gain control. These changes increase the forward gain in the second shunt feedback amplifier 306-2 while reducing the forward gain in the first shunt feedback amplifier 306-1. In this example configuration, Av1 equal to X*Av, and Av2 equal to (1−X)*Av are achieved. In another example configuration Av1 may be decreased while Av2 is increased but either one or both Av1 and Av2 may not scale linearly with X.

There may be other ways of implementing the voltage and current control. In FIG. 6, Vbc2 is controlled by the gain control 602 as a master control (or directly controlled), and Vb1, Vb2 and Ibef2 are controlled by the gain control 602 as slaved to the master control (or indirectly controlled). In some examples, Vb1 and Vb2 may be directly controlled (e.g., by the gain control 602) to provide a bias voltage with a low impedance over wide range of frequencies (e.g., up to 0.75*baud rate) through an NPN BJT in emitter follower configuration. In some examples, Vb1 and Vb2 are set by control loops which are slaved to the automatic gain control loop (e.g., a control loop of the gain control 602). Furthermore, Ibef2 may be set directly by the automatic gain control loop.

In one or more examples, a gain control (e.g., 312 in FIG. 3 or 602 in FIG. 6) may be sometimes referred to as a gain controller. A gain controller may include circuits (e.g., transistors) that may control voltages and currents.

In one or more aspects, a gain control (e.g., 312 in FIG. 3 or 602 in FIG. 6) may detect a signal produced at the output node of the transimpedance amplifier (e.g., 310 of FIG. 3), because this gain control (or the gain control loop) controls the gain of the subsequent stages (e.g., 308-1 to 308-n of FIG. 3) as well as the gain of the transimpedance stage (e.g., 306 of FIG. 3). The gain control may be configured to determine the sequence used to reduce the gain of each of the subsequent stages (e.g., 308-1 to 308-n of FIG. 3) of the circuits. The gain control may be a circuit having an analog control loop. As such, when the circuit is powered up, a signal is allowed to propagate through the different stages (e.g., 306, 308-1 to 308-n, 310, 314 and 312), and the gain control may determine whether the signal is excessively large or unsuitably small and make adjustments accordingly. For example, if the signal is excessively large, the gains may be reduced by using the gain control. When a variable transimpedance is present, one of the gain controls may be connected to the variable transimpedance as shown in FIG. 3 and FIG. 6. Many of the stages of the circuits (e.g., 306 and 308-1 to 308-n) may share a large part of the gain control with some specific controls for each of the stages.

In some examples, the components in the first shunt feedback amplifier may be similar to the components in the second shunt feedback amplifier.

Figure 7:
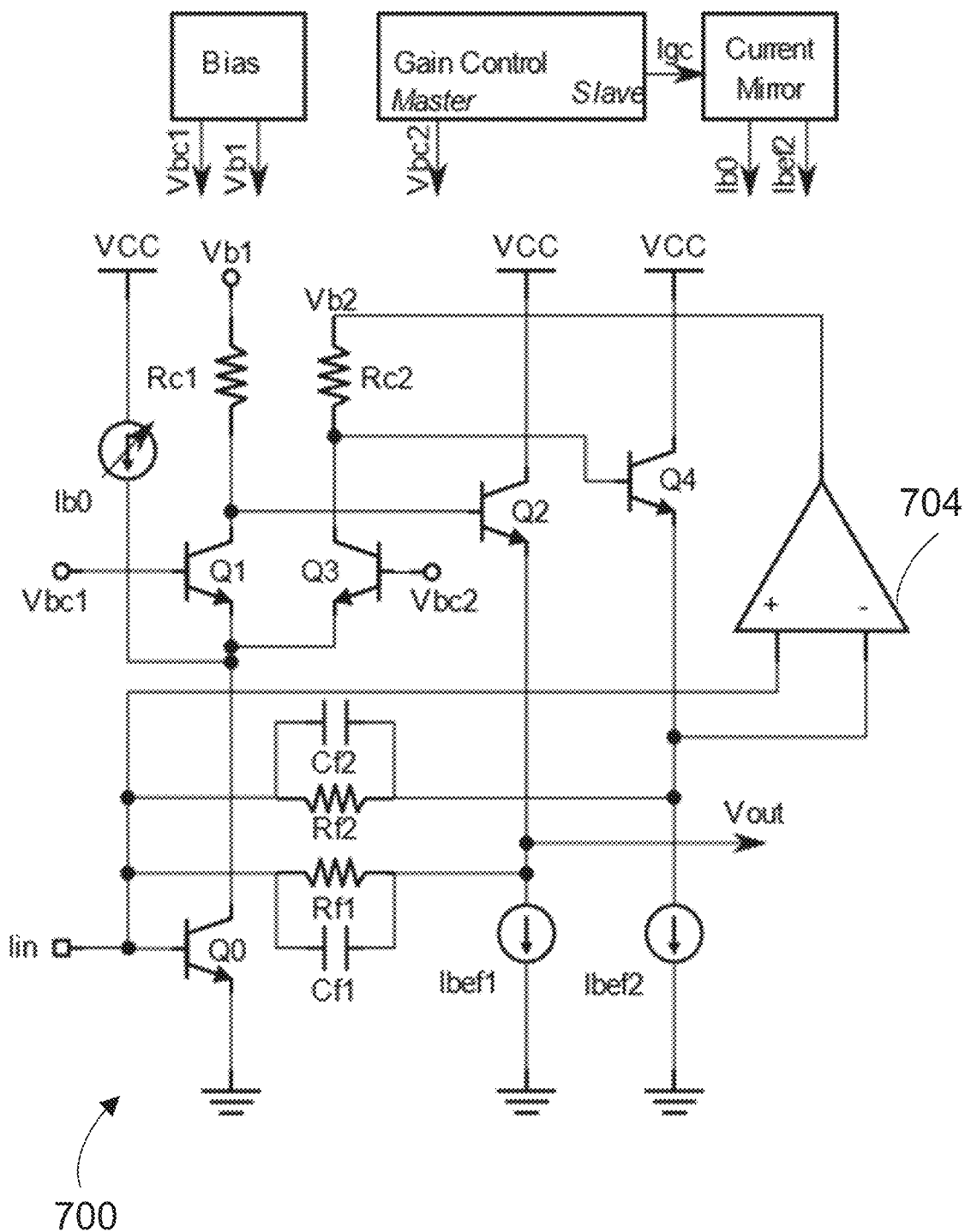
FIG. 7 illustrates a circuit diagram of another example of a variable transimpedance amplifier.

FIG. 7 illustrates a circuit diagram of an example of a variable transimpedance amplifier using BJTs. This provides another example of gain control.

The variable transimpedance amplifier 700 may be an implementation of the variable transimpedance amplifier/stage 306 of FIG. 3. The variable transimpedance amplifier 700 has similar structures as those of the variable transimpedance amplifier 600 in FIG. 6 with some modifications. For example, similar to FIG. 6, the first shunt feedback amplifier 306-1 may include transistors Q0, Q1, and Q2 and a current source Ibef1, and it may have a feedback path using a resistor Rf1 and a capacitor Cf1. The second shunt feedback amplifier 306-2 may include amplifiers Q0, Q3, and Q4 and a current source Ibef2, and it may have a feedback path using a resistor Rf2 and a capacitor Cf2. In FIG. 7, components similar or identical to those of FIG. 6 may be designated by like reference numerals, and their detailed descriptions may be omitted for brevity.

To vary the forward gain Av1 of the first shunt feedback amplifier 306-1, in one or more examples, the bias current of Q0 and gm0) may be directly varied while keeping the bias current of Q1 and gm1 essentially unchanged. In this case, the current in Q0 and Q1 is determined by a variable current source Ib0 and Vb1 which is fixed such that current through Q0 is the sum of Ib0 and Q1 current. The variable current source Ib0 may function as a boost current to boost the open loop gain of the first shunt feedback amplifier 306-1, which is increased by increasing the current source Ib0. To reduce forward gain Av1, 1b0 and gm0 is reduced which reduces forward voltage gain. As vbc2 is increased, the forward voltage gain Av2 increases in proportion to the current in Q3 relative to current in Q1, as the signal current is shunted away from Q1 to Q3, whereas the forward voltage gain Av1 decreases correspondingly. Therefore, the forward gain of the first shunt feedback amplifier 306-1 is reduced while forward gain of the second shunt feedback amplifier 306-2 is increased. Vbc2 may be a master control set by the gain control, and Ib0 may mirror the master control from Vbc2 (Igc) to change the forward gain of the first and the second shunt feedback amplifiers. Vbc1 is a fixed bias voltage and serves as a reference for Vbc2.

FIG. 7 further illustrates a mechanism to place the second shunt feedback amplifier into a high impedance state using Q4, Vb2 and Ibef2, and a control mechanism to slave Vb2 and Ibef2 currents to the master gain control Igc that controls the second shunt feedback amplifier gain through Vbc2. In the sensitivity state where Vbc2 is substantially lower than Vbc1 so as to reduce Q3 current to essentially 0, the slave current Ibef2 is reduced to very small value, while the error amplifier 704 reduces Vb2 such that the average or DC current through Rf2 is essentially 0. Ibef2 and Vb2 in concert force Q4 into a high impedance state such that the impedance at the emitter of Q4 is substantially higher than Rf2 so as to provide a high impedance from the second shunt feedback amplifier in the sensitivity state. To reduce transimpedance of the variable transimpedance stage, the gain control may first increase Ibef2 so as to bring Q4 out of high impedance state in concert with amplifier 704 and Vb2 and achieve a lower impedance at emitter of Q4 and a low output impedance of second open loop amplifier to enable Rf2 to shunt the first shunt feedback amplifier, thereby reducing effective Tz slightly. The gain control may next increase Vbc2 to increase Av2 to further reduce the Tz as discussed previously.

Figure 8:
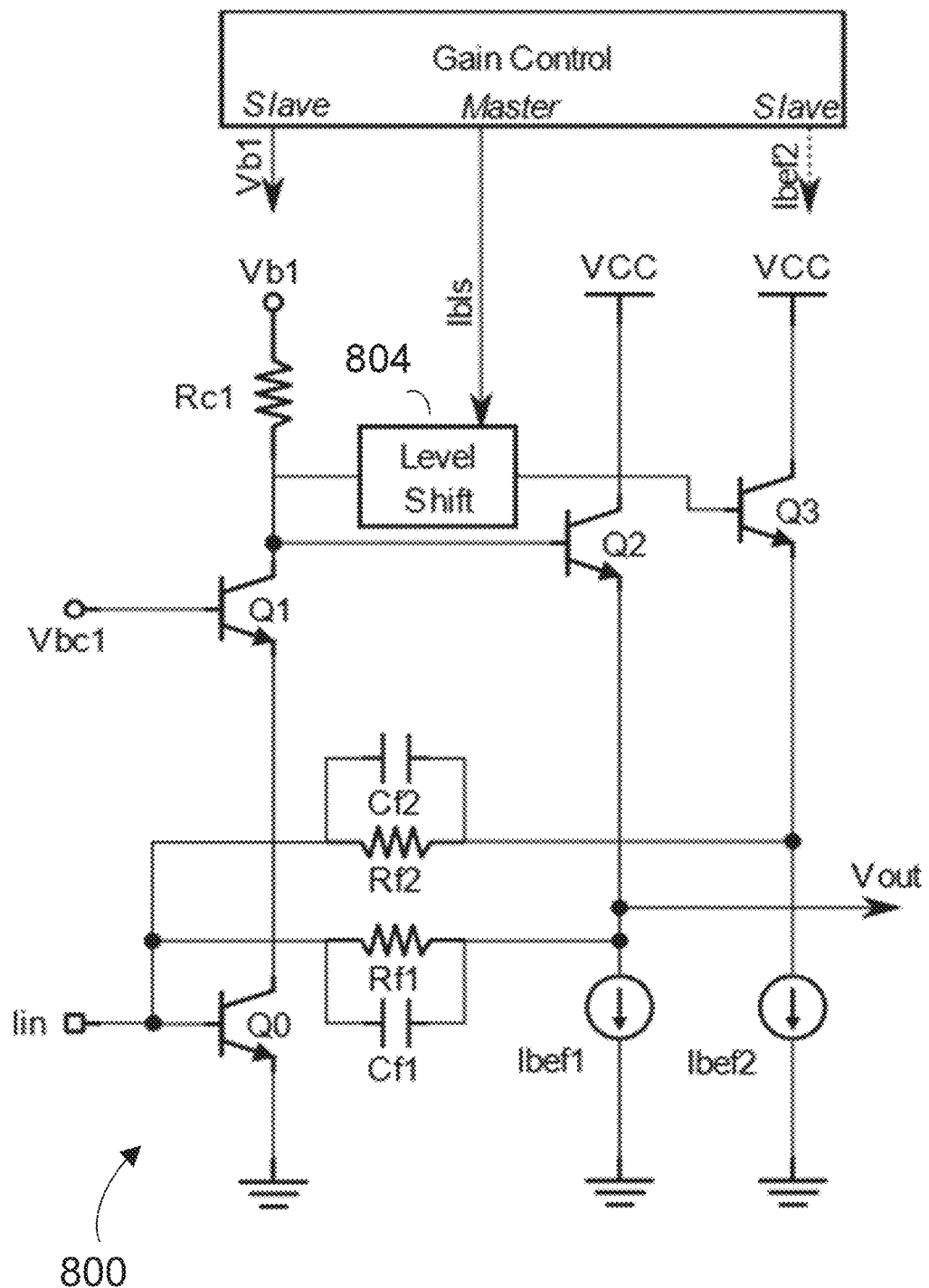
FIG. 8 illustrates a circuit diagram of an example of a simplified variable transimpedance amplifier.

FIG. 8 illustrates a circuit diagram of an example of a simplified variable transimpedance amplifier using BJTs.

The variable transimpedance amplifier 800 may be an implementation of the variable transimpedance amplifier/stage 306 of FIG. 3. The variable transimpedance amplifier 800 has similar structures as those of the variable transimpedance amplifier 600 in FIG. 6 with some modifications. For example, similar to FIG. 6, the first shunt feedback amplifier 306-1 may include transistors Q0, Q1, and Q2 and a current source Ibef1, and it may have a feedback path using a resistor Rf1 and a capacitor Cf1. In FIG. 8, components similar or identical to those of FIG. 6 may be designated by like reference numerals, and their detailed descriptions may be omitted for brevity.

The second shunt feedback amplifier 306-2 may include transistors Q0 and Q3 shown in FIG. 8 (instead of three transistors Q0, Q3 and Q4 shown in FIG. 6) and a current source Ibef2, and it may have a feedback path including a resistor Rf2 and a capacitor Cf2. The base of transistor Q3 may be connected to and controlled by a level shifter 804 which may be connected to a collector of the transistor Q1. The transistors Q2 and Q3 may function as buffers in emitter follower configuration. The second shunt feedback amplifier 306-2 may be placed into a high impedance state by using the level shifter 804 instead of Vb2 in FIG. 6 in combination with reduced Ibef2. The level shifter 804 may be implemented to place the second shunt feedback amplifier into a high impedance state so that at a sensitivity state, this path is essentially shut off. When a decreased transimpedance is desired, current may be shunted into the second shunt feedback amplifier 306-2. The level shifter 804 is controlled by a gain control to change the bias voltage at the base of the Q3, and the bias voltage may be increased to turn on the Q3, and increase Ibef2 which would turn on this path (e.g., Q1 to Q3 to Rf2). Using this level shifter 804, the second shunt feedback amplifier 306-2 may be transitioned into a high impedance state for sensitivity and a low impedance state for overload which indirectly changes the forward gain of the second shunt feedback amplifier. In an overload state, the Av2 of the second shunt feedback amplifier 306-2 may be increased from zero to a value that is equal to Av. Similar to the descriptions provided with reference to FIG. 6, the bias voltage Vb1 may be changed by gain control in concert with the impedance change of the second shunt feedback amplifier 306-2 for improving stability in low Tz state. In another example configuration, similar to the descriptions provided with reference to FIG. 7, a bias current into collector of Q0 to boost Av may be varied by gain control while Vb1 is kept unchanged in concert with the impedance change of the second shunt feedback amplifier 306-2 for improving stability in low Tz state.

In FIG. 8, the second shunt feedback amplifier 306-2 may have a fixed open loop gain Av2 to achieve a variable Tz but may suffer from a few drawbacks. For example, the gain Av2 of the second shunt feedback amplifier is fixed and not controlled directly. Instead, the impedance at the Q3 emitter is varied. The turn-on of the second shunt feedback amplifier loop may be abrupt due to the exponential relationship between the Q3 emitter impedance and Ibef2.

In one or more aspects, a gain control (e.g., the gain control 602 of FIG. 6, the gain control of FIG. 7, or the gain control of FIG. 8) may represent, or may be included in, an automatic gain control (e.g., AGC 312 of FIG. 3). The gain control (e.g., the gain control 602 of FIG. 6, the gain control of FIG. 7, or the gain control of FIG. 8) may receive its input signal (or an input signal level) from a peak detector (e.g., the peak detector 314 of FIG. 3) and may generate one or more of its output signals based on, among others, its input signal.

The variable transimpedance amplifier disclosed herein may have many advantageous features.

The variable transimpedance amplifier (e.g., 306) may reduce the linear dynamic range of the linear amplifier and thereby lower power consumption. A substantially lower power may be achieved when the variable transimpedance dynamic range is sufficiently high and input linear dynamic range sufficiently reduced, such that the linear amplifier may be operated with a lower supply voltage. For example, with the viable transimpedance amplifier disclosed herein, a lower supply voltage of 1.8 V may be used for linear amplifier, whereas in typical Bi-CMOS technologies an amplifier may need a supply voltage of at least 3.3 V. Therefore, a substantial improvement in power may be achieved. A maximum value of the transimpedance Tz (Tz_max) may be set for lower input referred noise (IRN) and fewer stages in linear amplifier for improved linearity and lower power. A minimum value of the transimpedance Tz (Tz_min) may be set for linearity over input signal dynamic range and lower power at overload. The Tr attenuation dynamic range (Tz_max/T_min) may be set by a ratio of Rf1 and Rf2 that is substantially insensitive to fabrication process variation and operating conditions (e.g., temperature). The stable Tz attenuation dynamic range may be available to the automatic gain control loop for achieving a fixed maximum Tz attenuation.

By implementing the variable transimpedance amplifier disclosed herein, the transimpedance for a sensitivity state may be independently chosen, which is the maximum transimpedance, and which enables lower input referred noise and low power. The transimpedance for an overload state may also be independently chosen, which is the minimum transimpedance, which is determined by the linearity for the overload state. The variable transimpedance amplifier may balance the tradeoff between sensitivity and overload.

A high data rate linear application requires a high frequency response that has high bandwidth and minimum distortion to minimize inter-symbol interference (ISI). When the transimpedance is varied, the high frequency response of the Tz stage can degrade as the stability margins of the feedback amplifier may degrade resulting in higher ISI and eventually lower SNR. Consequently, this is one of the limiting factors as to how much range of variable transimpedance may be achieved. The variable transimpedance amplifier disclosed herein is self-compensating for high frequency response and stability over the Tz dynamic range to a large extent. For example, the second shunt feedback amplifier (e.g., 306-2) may have its own separate compensation capacitor, which is optimized for the low Tz overload state thus stabilizing the response for low Tz condition, while the primary/first shunt feedback amplifier (e.g., 306-1)'s compensation capacitor is optimized for sensitivity response. For the sensitivity state the loading effect of the second compensation capacitor on the input is substantially minimized with the high impedance output of second amplifier (e.g., 306-2) in addition to minimizing noise contribution from Rf2, and therefore does not degrade sensitivity performance by any significant amount. When the transimpedance is attenuated, the variable Tz stage self-compensates for the response because as Av2 is increased, Av1 is decreased which in concert with the second compensation capacitor further improves stability of the Tz stage. Reducing the open loop gain Av1 in the primary/first shunt feedback amplifier (e.g., 306-1) as Tz is reduced, may (i) help improve stability and high frequency response, and (ii) prevent input impedance Rin from decreasing excessively, to help dampen high frequency peaking at a low Tz case. Additionally, due to the Miller effect, as Av2 is increased the effectiveness of the second feedback resistor Rf2 and second compensation capacitor Cf2 increases in proportion. Thus, a small capacitance value for Cf2 may be achieved, and the resistor value Rf2 may be a high value. This is beneficial as it means that the loading on the input at sensitivity is reduced, and there is less impact to the sensitivity performance, while compensating for the stability of the overall transimpedance amplifier.

Various example embodiments and aspects of the disclosure are described below for convenience. These are provided as examples, and do not limit the subject technology. Some of the examples described below are illustrated with respect to the figures disclosed herein simply for illustration purposes without limiting the scope of the subject technology.

One or more implementations provide a variable transimpedance amplifier (e.g., 306 of FIG. 3, 406 of FIG. 4, 600 of FIG. 6, 700 of FIG. 7, or 800 of FIG. 8). The variable transimpedance amplifier may include a first amplifier (e.g., 306-1 of FIG. 3 or 406-1 of FIG. 4) and a second amplifier (e.g., 306-2 of FIG. 3 or 406-2' of FIG. 4). The first amplifier may include: a first bipolar junction transistor amplifier (e.g., 306-1C of FIG. 3); a first resistor (e.g., 306-1B of FIG. 3) connected in parallel with the first bipolar junction transistor amplifier; and a first capacitor (e.g., 306-1A of FIG. 3) connected in parallel with the first bipolar junction transistor amplifier and the first resistor. The second amplifier may include: a second bipolar junction transistor amplifier (e.g., 306-2C of FIG. 3); a second resistor (e.g., 306-2B of FIG. 3) connected in parallel with the second bipolar junction transistor amplifier; and a second capacitor (e.g., 306-2A of FIG. 3) connected in parallel with the second bipolar junction transistor amplifier and the second resistor. In one or more examples, the first amplifier and the second amplifier are connected to an input node (e.g., 306-I of FIG. 3) of the variable transimpedance amplifier in parallel; a first output node (e.g., 306-1O of FIG. 3) of the first amplifier is an output node (e.g., 306-O of FIG. 3) of the variable transimpedance amplifier, the output node configured to drive a circuit subsequent to the variable transimpedance amplifier; and a second output node (e.g., 306-2O of FIG. 3) of the second amplifier is configured to be outside of the output node of the variable transimpedance amplifier, and the second output node is configured to be excluded from driving the circuit subsequent to the variable transimpedance amplifier.

In one or more examples, an open loop forward voltage gain (e.g., Av1 and/or Av2 described in FIG. 3) of each of the first and second bipolar junction transistor amplifiers is variable.

In one or more examples, open loop forward voltage gains of the first and second bipolar junction transistor amplifiers are configured to vary in opposite directions based on an input current (e.g., 306E of FIG. 3) of the variable transimpedance amplifier.

In one or more examples, when the input current is at a first current level (e.g., a sensitivity state described in FIG. 3), the open loop forward voltage gains of the first and second bipolar junction transistor amplifiers are at a first gain and a second gain, respectively; the first gain is higher than the second gain; and the first amplifier is configured to receive a first percentage of the input current at the first current level. In one or more examples, when the input current is at a second current level (e.g., an overload state described in FIG. 3) greater than the first current level, the open loop forward voltage gains of the first and second bipolar junction transistor amplifiers are at a third gain and a fourth gain, respectively; the third gain is lower than the first gain; the fourth gain is higher than the second gain; and the first amplifier is configured to receive a second percentage of the input current at the second current level, wherein the second percentage is less than the first percentage.

In one or more examples, an input impedance (e.g., Rin2 described in FIG. 3) of the second amplifier is variable, and when the input current is at the first current level, the input impedance of the second amplifier: is higher than an input impedance (e.g., Rin1 described in FIG. 3) of the first amplifier; is higher than a value of the second resistor; and is determined based on a sum of the value of the second resistor and an output impedance of the second bipolar junction transistor amplifier (e.g., Rin2=Rf2+Rout of the second bipolar junction transistor amplifier 306-2C described in FIG. 3), wherein the output impedance is higher than the value of the second resistor.

In one or more examples, each of the first and second resistors has a fixed value and is independent of an input current of the variable transimpedance amplifier.

In one or more examples, a transimpedance (e.g., $T_{zX}$ described in FIG. 3) of the variable transimpedance amplifier represents a ratio between an output voltage of the variable transimpedance amplifier and an input current of the variable transimpedance amplifier; the transimpedance is configured to be determined by the first resistor, the second resistor, and a scaling factor; and the transimpedance is independent of a maximum open loop forward voltage gain of the variable transimpedance amplifier (e.g., Av described in FIG. 3).

In one or more examples, the first and second bipolar junction transistor amplifiers comprise one shared input bipolar junction transistor (e.g., Q0 of FIG. 6) configured to receive an input current of the variable transimpedance amplifier.

In one or more examples, the first bipolar junction transistor amplifier and the second bipolar junction transistor amplifier are configured to be controlled by a gain control (e.g., 602 of FIG. 6), and the gain control is configured to control one or more circuits subsequent to the variable transimpedance amplifier.

In one or more examples, the variable transimpedance amplifier is configured to have a maximum open loop forward voltage gain of Av, and the first bipolar junction transistor amplifier is configured to have a first scaled open loop forward voltage gain of Av1, wherein, a ratio of Av1 to Av (which is X=Av1/Av) is configured to be controlled by the gain control, and the ratio (X) is between 0 to 1. In one or more examples, the ratio (X) is between 0.5 to 1.

In one or more examples, the first bipolar junction transistor amplifier is configured to have a first scaled open loop forward voltage gain of Av1, and the second bipolar junction transistor amplifier is configured to have a second scaled open loop forward voltage gain of Av2, wherein a ratio of Av1 to (Av1+Av2) (which is X=Av1/(Av1+Av2)) is configured to be controlled by the gain control, and wherein the ratio (X) is between 0 to 1. In one or more examples, the ratio (X) is between 0.5 to 1.

In one or more examples, the first bipolar junction transistor amplifier is configured to have a first scaled open loop forward voltage gain of Av1, and the second bipolar junction transistor amplifier is configured to have a second scaled open loop forward voltage gain of Av2, wherein Av1 changes inversely to Av2, and either one of or both of Av1 and Av2 is not scaled linearly with a ratio of Av1 to (Av1+Av2).

In one or more examples, the first resistor has a fixed resistor value of $R_{f1}$, and the second resistor has a fixed resistor value of $R_{f2}$, and a transimpedance $T_{zX}$ of the variable transimpedance amplifier is configured to be:

$$T_{zX} \approx -\frac{XR_{f1}}{(1-X)R_{f1}/R_{f2} + X}$$

In one or more examples, the second bipolar junction transistor amplifier comprises a first bipolar junction transistor (e.g., Q3 of FIG. 6) and a second bipolar junction transistor (e.g., Q4 of FIG. 6); a collector terminal of the first bipolar junction transistor is connected to a base terminal of the second bipolar junction transistor; the first bipolar junction transistor is configured to be controlled by a first bias voltage (e.g., Vbc2 of FIG. 6) applied to a base terminal of the first bipolar junction transistor; and the first bias voltage is configured to be provided from the gain control.

In one or more examples, the first bipolar junction transistor amplifier is configured to provide a first current to flow through the first bipolar junction transistor amplifier (e.g., Q3 of FIG. 6), based on the first bias voltage (e.g., Vbc2 of FIG. 6); and the second bipolar junction transistor of the second bipolar junction transistor amplifier is configured to provide a second current from the gain control to flow through the second bipolar junction transistor.

In one or more examples, the gain control is configured to control: the first bias voltage applied to the base terminal of the first bipolar junction transistor of the second bipolar junction transistor amplifier; a current (e.g., current through Ibef2 of FIG. 6) flowing through the second bipolar junction transistor (e.g., Q4 of FIG. 6) of the second bipolar junction transistor amplifier; a bias voltage (e.g., Vb1 of FIG. 6) applied to the first bipolar junction transistor amplifier; and a second bias voltage (e.g., Vb2 of FIG. 6) applied to the first bipolar junction transistor (e.g., Q3 of FIG. 6) of the second bipolar junction transistor amplifier.

In one or more examples, the first amplifier is a first inverting amplifier, and the second amplifier is a second inverting amplifier.

One or more implementations provide a variable transimpedance amplifier (e.g., 306 of FIG. 3, 406 of FIG. 4, 600 of FIG. 6, 700 of FIG. 7, or 800 of FIG. 8). The variable transimpedance amplifier may include a primary amplifier (e.g., 306-1 of FIG. 3 or 406-1 of FIG. 4) and one or more secondary amplifiers (e.g., 306-2 of FIG. 3 or 406-2' and 406-2" of FIG. 4). The primary amplifier may include: a primary transistor amplifier (e.g., 306-1C of FIG. 3); a primary resistor (e.g., 306-1B of FIG. 3) connected in parallel with the primary transistor amplifier; and a primary capacitor (e.g., 306-1A of FIG. 3) connected in parallel with the primary transistor amplifier and the primary resistor. The one or more secondary amplifiers, each may include: a secondary transistor amplifier (e.g., 306-2C of FIG. 3); a secondary resistor (e.g., 306-2B of FIG. 3) connected in parallel with the secondary transistor amplifier; and a secondary capacitor (e.g., 306-2A of FIG. 3) connected in parallel with the secondary transistor amplifier and the secondary resistor. In one or more examples, the primary amplifier and the one or more secondary amplifiers are connected to an input node (e.g., 306-I of FIG. 3) of the variable transimpedance amplifier in parallel; a primary output node (e.g., 306-1O of FIG. 3) of the primary amplifier is an output node (e.g., 306-O of FIG. 3) of the variable transimpedance amplifier, the output node configured to drive a circuit subsequent to the variable transimpedance amplifier; and secondary output nodes (e.g., 306-2O of FIG. 3) of the one or more secondary amplifiers are configured to be outside of the output node of the variable transimpedance amplifier, the secondary output nodes configured to be excluded from driving the circuit subsequent to the variable transimpedance amplifier.

In one or more examples, open loop forward voltage gains (e.g., Av1 and/or Av2 described in FIG. 3) of the primary transistor amplifier and the secondary transistor amplifier are configured to vary in opposite directions based on an input current of the variable transimpedance amplifier.

In one or more examples, each of the primary resistor and the secondary resistor has a fixed value and is independent of an input current of the variable transimpedance amplifier.

In one or more examples, a transimpedance of the variable transimpedance amplifier represents a ratio between an output voltage of the variable transimpedance amplifier and an input current of the variable transimpedance amplifier; the transimpedance is configured to be determined by the primary resistor, the secondary resistor, and a scaling factor; and the transimpedance is independent of an open loop gain of the variable transimpedance amplifier (e.g., Av described in FIG. 3).

In one or more examples, the primary transistor amplifier and the secondary transistor amplifier comprise one shared input transistor configured to receive an input current of the variable transimpedance amplifier.

In one or more aspects, a method includes one or more methods, operations or portions thereof described herein. In one or more aspects, an apparatus includes one or more memories and one or more processors, the one or more processors configured to cause performing one or more methods, operations or portions thereof described herein. In one or more aspects, an apparatus includes means adapted for performing one or more methods, operations or portions thereof described herein. In one or more aspects, a hardware apparatus includes circuits configured to perform one or more methods, operations or portions thereof described herein. In one or more aspects, an apparatus includes components operable to carry out one or more methods, operations or portions thereof described herein. In one or more aspects, a non-transitory machine-readable storage medium (e.g., one or more memories and/or one or more registers) store instructions that, when executed by one or more processors, cause one or more processors to perform one or more methods, operations or portions thereof described herein.

Further examples of the subject technology include various subsets of the above examples combined or otherwise re-arranged in various forms.

In some examples, to illustrate the interchangeability of hardware and software, items such as the various illustrative blocks, modules, components, methods, operations, instructions, and algorithms may have been described generally in terms of their functionality. In some examples, whether such functionality is implemented as hardware, software or a combination of hardware and software depends upon the particular application and design constraints imposed on the overall system. Skilled artisans may implement the described functionality in varying ways for each particular application.

Headings and subheadings, if any, are used for convenience only and do not limit the invention. The word "exemplary" is used to mean serving as an example or illustration. Any implementation described herein as an "example" is not necessarily to be construed as preferred or advantageous over other implementations. Relational terms such as first and second and the like may be used simply for ease of understanding without necessarily requiring or implying any actual relationship or order between elements or actions and without necessarily requiring or implying that they have different characteristics unless stated otherwise.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" and "at least one of A, B, or C" may refer to only A, only B, or only C; any combination of A, B, and C; and/or at least one of each of A, B, and C.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression "element A/element B" may be understood as element A and/or element B.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In one aspect, the blocks or components described in this present disclosure (e.g., components in FIGS. 3-8) may be implemented in circuits or integrated circuits. A circuit or an integrated circuit may include one or more transistors.

In one or more aspects, a transistor may include one or more bipolar junction transistors (BJTs), which may refer to any of a variety of multi-terminal transistors operating on the principal of carrying current using both electrons and holes, including, but not limited to, an n-p-n BJT (NPN BJT) and a p-n-p BJT (PNP BJT).

In one or more aspects, transistors may include one or more field effect transistors (FETs), which may refer to any of a variety of multi-terminal transistors operating on the principals of controlling an electric field to control the shape and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET). A MOSFET may be an n-type MOSFET (NMOS) or a p-type MOSFET (PMOS). A complementary metal-oxide semiconductor (CMOS) device may include an NMOS and a PMOS.

In one or more aspects, transistors may include one or more BJTs and FETs. In one or more examples, transistors may include one or more BJTs and one or more CMOS devices, which may be referred to as Bi-CMOS devices.

Unless otherwise mentioned, various configurations described in the present disclosure may be implemented on a silicon, silicon-germanium (SiGe), gallium arsenide (GaAs), indium phosphide (InP) or indium gallium phosphide (InGaP) substrate, or any other suitable substrate.

In one aspect, the terms base, emitter, and collector may refer to three terminals of a transistor and may refer to a base, an emitter and a collector of a bipolar junction transistor or may refer to a gate, a source, and a drain of a field effect transistor, respectively, and vice versa. In another aspect, the terms gate, source, and drain may refer to base, emitter, and collector of a transistor, respectively, and vice versa. In some aspects, a source and a drain may be used interchangeably.

While FIGS. 3-8 are illustrated primarily with BJTs, the transistors implemented in the variable transimpedance stage 306 are not limited thereto. In one or more examples, the transistors may include other types such as FETs and/or some combination of BJTs and FETs if FETs have sufficiently low parasitic resistance and capacitance. Furthermore, while FIGS. 3-8 are illustrated primarily with NPN BJTs, the transistors implemented in the variable transimpedance stage 306 are not limited thereto. In one or more examples, the transistors may include various types such as NPN BJTs, PNP BJTs, some types of FETs (e.g., NMOS or PMOS) and/or some combination thereof if the devices have sufficiently low parasitic resistance and capacitance.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In describing a temporal relationship, when the temporal order is described as, for example, "after," "subsequent," "next," "before," "preceding," "prior to," or the like, a case that is not consecutive or not sequential may be included unless a more limiting term, such as "just," "immediate(ly)," or "direct(ly)," is used.

It is understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure.

In describing elements of the present disclosure, the terms "first," "second," "A," "B," "(a)." "(b)," or the like may be used. These terms are intended to identify the corresponding element(s) from the other element(s), and these are not used to define the essence, basis, order, or number of the elements.

In one or more examples, when an element is "connected" or "coupled" to another element, the element can be directly connected or coupled to another element, and can be indirectly connected or coupled to another element with one or more intervening elements disposed or interposed between the elements, unless otherwise specified.

The disclosure is provided to enable any person skilled in the art to practice the various aspects described herein. In some instances, when a detailed description of well-known functions or configurations may unnecessarily obscure aspects of the present disclosure, the detailed description thereof may have been omitted. The disclosure provides various examples of the subject technology, and the subject technology is not limited to these examples. Various modifications to these aspects will be readily apparent to those skilled in the art, and the principles described herein may be applied to other aspects.

Unless stated otherwise, like reference numerals refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

When the term "comprise," "have," "include," "contain," "constitute," or the like is used, one or more other elements may be added unless a term such as "only" or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. An element proceeded by "a." "an," "the," or "said" does not, without further constraints, preclude the existence of additional elements.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, or the like). Furthermore, while the subject disclosure may provide many example ranges and values, these are non-limiting examples, and other ranges and values are within the scope of the subject technology.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A variable transimpedance amplifier, comprising:
   a first amplifier comprising:
      a first bipolar junction transistor amplifier;
      a first resistor connected in parallel with the first bipolar junction transistor amplifier; and
      a first capacitor connected in parallel with the first bipolar junction transistor amplifier and the first resistor; and
   a second amplifier comprising:
      a second bipolar junction transistor amplifier;
      a second resistor connected in parallel with the second bipolar junction transistor amplifier; and
      a second capacitor connected in parallel with the second bipolar junction transistor amplifier and the second resistor;
   wherein:
   the first amplifier and the second amplifier are connected to an input node of the variable transimpedance amplifier in parallel;
   a first output node of the first amplifier is an output node of the variable transimpedance amplifier, the output node configured to drive a circuit subsequent to the variable transimpedance amplifier; and
   a second output node of the second amplifier is configured to be outside of the output node of the variable transimpedance amplifier, the second output node configured to be excluded from driving the circuit subsequent to the variable transimpedance amplifier.

2. The variable transimpedance amplifier according to claim 1, wherein:
   an open loop forward voltage gain of each of the first and second bipolar junction transistor amplifiers is variable.

3. The variable transimpedance amplifier according to claim 1, wherein:
   open loop forward voltage gains of the first and second bipolar junction transistor amplifiers are configured to vary in opposite directions based on an input current of the variable transimpedance amplifier.

4. The variable transimpedance amplifier according to claim 3,
   wherein when the input current is at a first current level,
      the open loop forward voltage gains of the first and second bipolar junction transistor amplifiers are at a first gain and a second gain, respectively;
      the first gain is higher than the second gain; and
      the first amplifier is configured to receive a first percentage of the input current at the first current level, and
   wherein when the input current is at a second current level greater than the first current level,
      the open loop forward voltage gains of the first and second bipolar junction transistor amplifiers are at a third gain and a fourth gain, respectively;
      the third gain is lower than the first gain;
      the fourth gain is higher than the second gain; and
      the first amplifier is configured to receive a second percentage of the input current at the second current level, wherein the second percentage is less than the first percentage.

5. The variable transimpedance amplifier according to claim 4,
   wherein an input impedance of the second amplifier is variable, and
   wherein when the input current is at the first current level, the input impedance of the second amplifier:
      is higher than an input impedance of the first amplifier;
      is higher than a value of the second resistor; and
      is determined based on a sum of the value of the second resistor and an output impedance of the second bipolar junction transistor amplifier, wherein the output impedance is higher than the value of the second resistor.

6. The variable transimpedance amplifier according to claim 1, wherein:
   each of the first and second resistors has a fixed value and is independent of an input current of the variable transimpedance amplifier.

7. The variable transimpedance amplifier according to claim 1, wherein:
   a transimpedance of the variable transimpedance amplifier represents a ratio between an output voltage of the variable transimpedance amplifier and an input current of the variable transimpedance amplifier;
   the transimpedance is configured to be determined by the first resistor, the second resistor, and a scaling factor; and
   the transimpedance is independent of a maximum open loop forward voltage gain of the variable transimpedance amplifier.

8. The variable transimpedance amplifier according to claim 1, wherein:

the first and second bipolar junction transistor amplifiers comprise one shared input bipolar junction transistor configured to receive an input current of the variable transimpedance amplifier.

9. The variable transimpedance amplifier according to claim 1, wherein the first bipolar junction transistor amplifier and the second bipolar junction transistor amplifier are configured to be controlled by a gain control, and the gain control is configured to control one or more circuits subsequent to the variable transimpedance amplifier.

10. The variable transimpedance amplifier according to claim 9, wherein the variable transimpedance amplifier is configured to have a maximum open loop forward voltage gain of Av, wherein the first bipolar junction transistor amplifier is configured to have a first scaled open loop forward voltage gain of Av1, wherein a ratio of Av1 to Av (which is X=Av1/Av) is configured to be controlled by the gain control, and wherein the ratio (X) is between 0.5 to 1.

11. The variable transimpedance amplifier according to claim 9, wherein the first bipolar junction transistor amplifier is configured to have a first scaled open loop forward voltage gain of Av1, wherein the second bipolar junction transistor amplifier is configured to have a second scaled open loop forward voltage gain of Av2, wherein a ratio of Av1 to (Av1+Av2) (which is X=Av1/(Av1+Av2)) is configured to be controlled by the gain control, and wherein the ratio (X) is between 0 to 1.

12. The variable transimpedance amplifier according to claim 11, wherein the ratio (X) is between 0.5 to 1.

13. The variable transimpedance amplifier according to claim 11, wherein the first resistor has a fixed resistor value of $R_{f1}$, and the second resistor has a fixed resistor value of $R_{f2}$, and a transimpedance $T_{zX}$ of the variable transimpedance amplifier is configured to be:

$$T_{zX} \approx -\frac{XR_{f1}}{(1-X)R_{f1}/R_{f2}+X}.$$

14. The variable transimpedance amplifier according to claim 9, wherein:
the second bipolar junction transistor amplifier comprises a first bipolar junction transistor and a second bipolar junction transistor;
a collector terminal of the first bipolar junction transistor is connected to a base terminal of the second bipolar junction transistor;
the first bipolar junction transistor is configured to be controlled by a first bias voltage applied to a base terminal of the first bipolar junction transistor; and
the first bias voltage is configured to be provided from the gain control.

15. The variable transimpedance amplifier according to claim 14, wherein:
the first bipolar junction transistor amplifier is configured to provide a first current to flow through the first bipolar junction transistor amplifier, based on the first bias voltage; and
the second bipolar junction transistor of the second bipolar junction transistor amplifier is configured to provide a second current from the gain control to flow through the second bipolar junction transistor.

16. The variable transimpedance amplifier according to claim 14, wherein:
the gain control is configured to control:
the first bias voltage applied to the base terminal of the first bipolar junction transistor of the second bipolar junction transistor amplifier;
a current flowing through the second bipolar junction transistor of the second bipolar junction transistor amplifier;
a bias voltage applied to the first bipolar junction transistor amplifier; and
a second bias voltage applied to the first bipolar junction transistor of the second bipolar junction transistor amplifier.

17. The variable transimpedance amplifier according to claim 1, wherein the first amplifier is a first inverting amplifier, and the second amplifier is a second inverting amplifier.

18. A variable transimpedance amplifier, comprising:
a primary amplifier comprising:
a primary transistor amplifier;
a primary resistor connected in parallel with the primary transistor amplifier; and
a primary capacitor connected in parallel with the primary transistor amplifier and the primary resistor; and
one or more secondary amplifiers, each comprising:
a secondary transistor amplifier;
a secondary resistor connected in parallel with the secondary transistor amplifier; and
a secondary capacitor connected in parallel with the secondary transistor amplifier and the secondary resistor;
wherein:
the primary amplifier and the one or more secondary amplifiers are connected to an input node of the variable transimpedance amplifier in parallel;
a primary output node of the primary amplifier is an output node of the variable transimpedance amplifier, the output node configured to drive a circuit subsequent to the variable transimpedance amplifier; and
secondary output nodes of the one or more secondary amplifiers are configured to be outside of the output node of the variable transimpedance amplifier, the secondary output nodes configured to be excluded from driving the circuit subsequent to the variable transimpedance amplifier.

19. The variable transimpedance amplifier according to claim 18, wherein:
open loop forward voltage gains of the primary transistor amplifier and the secondary transistor amplifier are configured to vary in opposite directions based on an input current of the variable transimpedance amplifier.

20. The variable transimpedance amplifier according to claim 18, wherein:
each of the primary resistor and the secondary resistor has a fixed value and is independent of an input current of the variable transimpedance amplifier.

21. The variable transimpedance amplifier according to claim 18, wherein:
a transimpedance of the variable transimpedance amplifier represents a ratio between an output voltage of the variable transimpedance amplifier and an input current of the variable transimpedance amplifier;
the transimpedance is configured to be determined by the primary resistor, the secondary resistor, and a scaling factor; and
the transimpedance is independent of an open loop gain of the variable transimpedance amplifier.

22. The variable transimpedance amplifier according to claim 18, wherein:
the primary transistor amplifier and the secondary transistor amplifier comprise one shared input transistor configured to receive an input current of the variable transimpedance amplifier.

\* \* \* \* \*